(12) United States Patent
Katsnelson et al.

(10) Patent No.: US 8,483,019 B2
(45) Date of Patent: *Jul. 9, 2013

(54) MAGNETO-OPTICAL DEVICE WITH AN OPTICALLY INDUCED MAGNETIZATION

(76) Inventors: Esfir Z. Katsnelson, Evanston, IL (US); Mark M. Chervinsky, St. Petersburg (RU)

( * ) Notice: Subject to any disclaimer, the term of this patent is extended or adjusted under 35 U.S.C. 154(b) by 0 days.

This patent is subject to a terminal disclaimer.

(21) Appl. No.: 13/506,115

(22) Filed: Mar. 28, 2012

(65) Prior Publication Data

US 2012/0207002 A1    Aug. 16, 2012

Related U.S. Application Data

(63) Continuation of application No. 13/067,318, filed on May 24, 2011, now Pat. No. 8,154,957, which is a continuation of application No. 12/929,879, filed on Feb. 23, 2011, now abandoned.

(60) Provisional application No. 61/339,122, filed on Mar. 1, 2010.

(51) Int. Cl.
*G11B 11/00* (2006.01)

(52) U.S. Cl.
USPC ........................................ 369/13.02

(58) Field of Classification Search
None
See application file for complete search history.

(56) References Cited

U.S. PATENT DOCUMENTS

| | | | |
|---|---|---|---|
| 8,154,957 B1* | 4/2012 | Katsnelson et al. | 369/13.01 |
| 2007/0274003 A1* | 11/2007 | Ota et al. | 360/126 |
| 2008/0311429 A1* | 12/2008 | Katsuragawa et al. | 428/820.1 |
| 2010/0073806 A1* | 3/2010 | Koui et al. | 360/75 |
| 2011/0199867 A1* | 8/2011 | Stipe | 369/13.24 |

* cited by examiner

*Primary Examiner* — Adam R Giesy
*Assistant Examiner* — Henok Heyi

(57) ABSTRACT

A magneto-optical device (MOD) with optically induced magnetization for use in magnetic field sensors as a magnetic element pinning a magnetization in a preferred direction of a ferromagnetic layer as well as a magnetic memory cell for magneto-optical recording. The MOD comprises the Mg—Mg—Co ferrite film deposited on a magnesium oxide (MgO) substrate. The ferrite film is illuminated at room temperature with a circularly polarized light (CPL) in a static magnetic H-field (about of 3 kOe) normal to the illuminated ferrite film surface. At certain ("writing") combinations of H, sigma (CPL helicity), the long-lived optically induced magnetization with a unidirectional anisotropy, stable to a conventional demagnetization occurs. For readout of information, conventional magnetoresistive sensors and MFM can be used. To erase information, the ferrite film should be illuminated with two field-light combinations, other than "writing", or annealed at temperature higher than 530 degrees C.

8 Claims, 12 Drawing Sheets

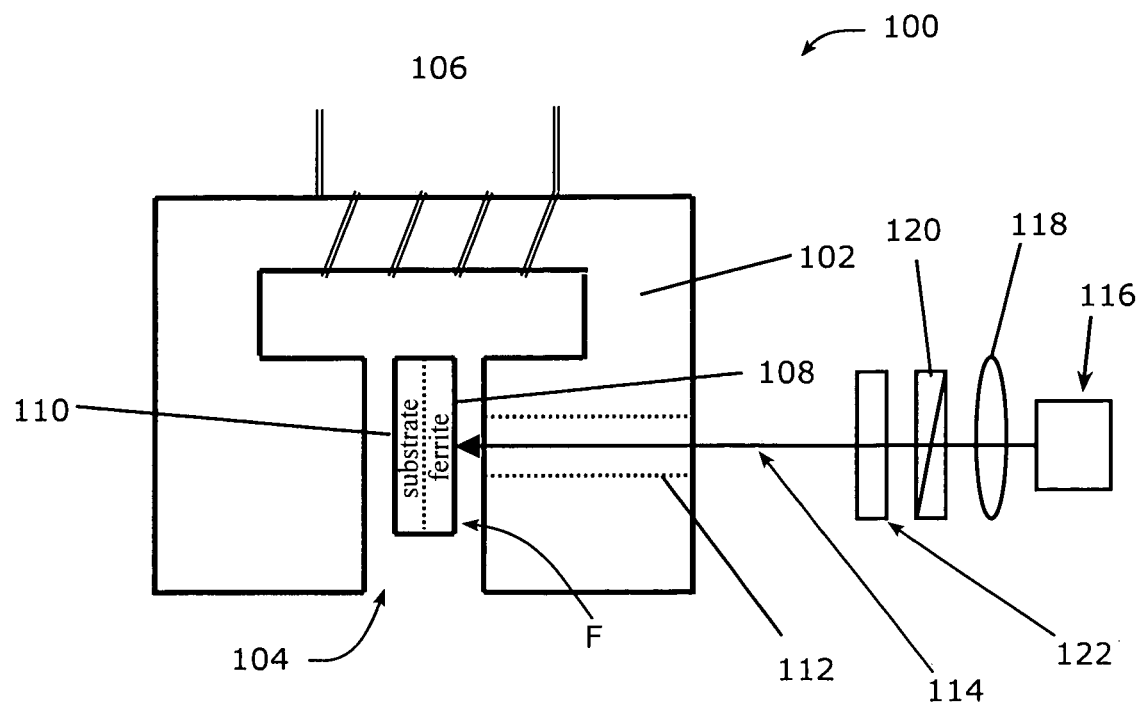
FIG. 3
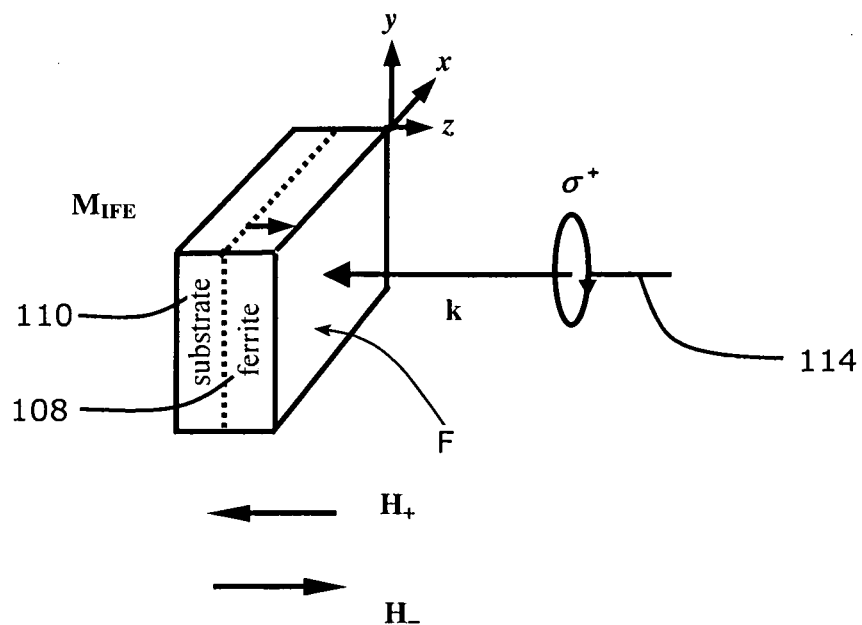
FIG. 3.1

MAGNETO-OPTICAL DEVICE WITH AN OPTICALLY INDUCED MAGNETIZATION

CROSS-REFERENCE TO RELATED PATENT APPLICATION

The application is a continuation of earlier-filed U.S. patent application Ser. No. 13/067,318 filed May 24, 2011, now U.S. Pat. No. 8,154,957 issued Apr. 10, 2012, which is a continuation of earlier-filed U.S. patent application Ser. No. 12/929,879 filed Feb. 23, 2011, now abandoned, by the inventors herein and claims the benefit of earlier-filed U.S. Provisional Patent Application 61/339,122, filed Mar. 1, 2010 by the inventors herein, the disclosure of which is incorporated herein by reference.

TECHNICAL FIELD

The patent application relates in general to magneto-optical devices (MODs), which involve new magnetic properties created and changed by light, but up to now not realized in magnetic materials. New magnetic properties comprise an optically induced magnetic memory with an indefinitely long relaxation time, the long-lived optically induced unidirectional anisotropy, and an optically induced increase in the Curie temperature. New photo-induced magnetic properties allow the data to be written, stored and reproduced. A magneto-optical memory based on the optically induced magnetization, which appears on illumination of a ferrimagnetic material with a particular combination of the circularly polarized light (CPL) and a static magnetic field using the Faraday effect geometry (as the wave vector of light and magnetic field are normal to the ferrite film illuminatable surface). In particular, the present invention relates to the magnetic transducers, which involve magnetoresistive (MR) sensors (based on the spin valve and magnetic tunnel junction effects) as well as microscopic tips of the MFM reading an information signal from a magnetic surface. These transducers can be improved, if conventional magnetic elements, which fix a direction of magnetic moment into ferromagnetic layers, will be replaced with MODs.

The patent application relates also to memory storage systems with memory cells, and particularly, to real (non-thermomagnetic) magneto-optical recording. The magneto-optical recording can be improved and simplified if magnetic moments are recorded into memory cells incorporated MODs. The optically induced magnetization, which appears in the MOD, increases the Curie temperature of the ferrimagnetic material by about 140 degrees C. and thereby improves a stability of the high-density magnetic medium against the so-called superparamagnetic effect.

DESCRIPTION OF RELATED ART

The prior art discloses information of reading data from a magnetic surface with magnetoresistive (MR) sensors or read heads, which are described, for example, by McFadien et al. in "State-of-the-Art Magnetic Hard Disk Drives", *MRS Bulletin*, vol. 31, May 2006, pp. 379-383. A detailed description of the magnetic sensor based on the MR spin-valve effect can be found, for example, in the U.S. Pat. No. 5,206,590. Information of magnetic tunnel junction sensors is disclosed, for example, in the U.S. Pat. No. 5,729,410. The measurement of residual magnetic fields provided with a microscopic tip of the magnetic force microscope (MFM) using a needle (with a tip), which is formed near the free end of a cantilever, is described, for example, by Chen et al. in the U.S. Pat. No. 6,448,765.

The MR sensor detects magnetic fields via a change in the resistance of the MR element. The MR element, which based on the spin valve effect, comprises a first and second thin film layers of the ferromagnetic (FM) material, separated with a nonmagnetic metallic material. The resistance between two magnetically uncoupled FM layers varies as cosine of the angle between magnetizations. The resistance is independent of the direction of current flow. The magnetic moment of the first FM layer is free to rotate in the presence of an applied magnetic field (free layer). The magnetic moment of the second layer is fixed or pinned (fixed or pinned layer). Magnetic moments of both layers are set perpendicularly to each other at a zero magnetic field. A coercivity of the fixed FM layer is higher than that of the free layer. The direction of magnetic moment can be fixed by one of two methods known from the art: either using an exchange bias effect or a hard magnetic layer. As current flows through the MR sensor, the voltage across the sensor changes with a change in resistance. This change is produced by the rotation of magnetization in the free layer. The rotation value depends on the magnetization of a sensed layer and an angle between magnetizations of the first and second FM layers.

Sensing magnetic fields (from a magnetic medium) vary in strength. To obtain continuous changes in sensitivity and linearity in the outputs of sensors, FM layers in a read head are transformed in single domains using the two above described methods.

A phenomenon of an exchange anisotropy is also well known from the art. A principle of fabrication of an exchange bias element was provided by W. H. Meiklejohn et al. in "New Magnetic Anisotropy", Physical Review, vol. 102, No. 5, Jun. 1, 1956, pp. 1413-1414. It was also described by Chikazumi in "*Physics of Ferromagnetism*", 2nd Ed., 1997, Clarendon Press-Oxford, pp. 329-331 and Nogus et al. "Exchange Bias", Journal of Magnetism and Magnetic Materials, vol. 192, 15 Feb. 1999, pp. 203-232. The conventional exchange bias element comprises a composite of two materials: ferromagnetic (FM)/antiferromagnetic (AFM). When the composite is cooled down to temperatures much lower than the Neel point in a magnetic field, which is applied away from an AFM easy direction, an exchange anisotropy is formed at the FM/AFM interface as a result of an interaction between FM and AFM materials. This interaction produces a unidirectional anisotropy, which is accompanied with a displacement of the hysteresis loop along the magnetic field with an alteration in loop parameters. An induced magnetic anisotropy can result also from a magnetic annealing procedure, when the composite of FM and AFM materials is heated above some critical temperature and then cooled in an applied magnetic field. Hempstead et al. (U.S. Pat. No. 4,103,315) utilized the AFM-FM exchange coupling to provide a uniform biased field for MR sensors.

For mapping the magnetic field of an object, the magnetic force microscope (MFM) can be used. The MFM can also measure the performance of magnetic MR or GMR sensors as well as a quality of magnetic recording (overwrite characteristics) as, for example, was described by D. Rugar et al., in a paper "Magnetic Force Microscopy: General Principles and Application to Longitudinal Recording Media", Journal of Applied Physics, vol. 68, August 1990, pp. 1169-1183.

A conventional magnetized microscopic tip of a needle is held near a free end of a cantilever. A magnetic field of the object can be detected by measuring the magnetic force acting between the object and the tip. To provide a high resolution mapping of MR or GMR sensors, the MFM tip should be located at the distance of about 100 nm from the magnetic medium of the sensor, but should not change the magnetization of the medium with an excessive magnetic field. With this goal in mind, the magnitude of magnetic moment of a conventional tip, which is utilized for the MFM needle, was reduced. The direction of magnetic moment is set using a conventional exchange bias element (Chen et al., U.S. Pat. No. 6,448,765).

The conventional magnetic needle of the MFM comprises a FM layer that produces the magnetic field and a pinning layer, which preserves the direction of this field.

Conventional exchange bias elements, which currently are utilized in conventional magnetoresistive read heads and in the MFM, display a number of drawbacks:

A conventional exchange bias element should comprise, at least, two different magnetic materials: FM and AFM in direct atomic contact.

A fabrication of the conventional FM/AFM element with an exchange coupling, which results in the unidirectional anisotropy, involves a number of complex labour consuming procedures. The fabrication comprises: a deposition of the AFM layer on the FM layer at a high applied magnetic field, high temperature heating of the AFM/FM composite with subsequent cooling at the magnetic field (Hempstead et al., U.S. Pat. No. 4,103,315); a deposition of the layer of hard magnetic material on the soft FM layer also at high applied magnetic fields (Dieny et al., U.S. Pat. No. 5,206,590. Annealing at high temperatures (200-300 degrees C.) leads to the temperature hysteresis of the magnetic permeability with irreversible changes in the magnetic properties of FM layers, for example, such as a reduction of permeability and an increase in a coercivity. A great number of complex procedures lead also to an excessive labour and thus a production costs.

Conventionally used AFM layers are sensitive to a corrosion and temperature. Therefore manufacturing conventional bias elements requires a utilization of alloys with expensive noble metals (for example, such as PtMn and IrMn and Ta as protective layer) with excessive production procedures. For example, the fabrication of the conventional exchange bias element involves a deposition of the AFM PtMn layer with a protective (rare earth) Ta layer on the FM (fixed) layer with subsequent annealing at 250 degrees C. at the applied magnetic field of 10 kOe in the vacuum (Furukava et al., U.S. Pat. No. 7,243,412).

The fabrication of conventional exchange bias elements involves an essential difficulty when successive layers of the read head should be biased in different directions. In this case, annealing of last layers can reorient all of previously oriented layers in a same direction as the last one (Hempsted et al, U.S. Pat. No. 4,103,315). Therefore for the second (or third) pair of layers (free and fixed), manufacturing the conventional magnetic bias element involves additional and thus costly fabrication procedures such as resetting, which refreshes the direction of the bias field in the hard bias layer (Wang et al., U.S. Pat. No. 7,230,845). A room-temperature deposition along the direction perpendicular to the first (fixed) layer is also used, but at the large magnetic field of 10 kOe (Furukava et al., U.S. Pat. No. 7,243,412). Aforesaid leads to additional labour expenses with a price increase.

A utilization of the present invention, which uses the MOD as magnetic element pinning magnetization of FM layers, will remove the foregoing drawbacks, simplify manufacturing, and reduce the production cost for read heads and the MFM.

More than 50 years, the longitudinal magnetic recording is a basic recording principle of conventional magnetic recording. The latter comprises writing, storage, and reading magnetic information from a recording medium (I. R. McFadien et al., "State-of-the-Art Magnetic Hard Disk Drives", MRS Bulletin, vol. 31, May 2006, pp. 379-383).

The conventional magnetic recording in the FM medium is described, for example, in a paper by Richter, "Recent Advances in the Recording Physics of Thin-film Media", Journal of Physics D: Applied Physics, vol. 32, August 1999, pp. R147-R168. At the longitudinal writing and storage of information, a magnetization is recorded and lies in a plane of storage medium. Ones and zeroes correspond to the presence or absence of the magnetization reversal. In fact, the recording medium is made up of two FM layers separated by a thin nonmagnetic ruthenium layer what results in antiferromagnetic coupling FM layers via an indirect exchange mediated by the ruthenium. The complicated two-layered structure of the writing medium is set a goal to reduce the composite noise power with an increase in the SNR (signal-to-noise ratio). Complex processes with a magnetization transition take place in upper and lower layers of the medium during writing the information. The data are read back by measuring stray fields originated from transitions between regions of opposite magnetization, but not the magnetization directly. This analog signal is then processed to recover the digital information (I. R. McFadien et al., "State-of-the-Art Magnetic Hard Disk Drives", MRS Bulletin, vol. 31, May 2006, pp. 379-383).

The longitudinal recording is accompanied with complicated processes and calculations. Following disadvantages, for example, can be indicated:

For the high-quality writing (into narrow tracks without unwanted erasure), large (about 6 kOe) magnetic fields with a high field gradient should be used. However the field gradient determines the length of bit and a linear density of recording. The large value of gradient limits the recording density.

The recording density is also limited by such factors as, for example, areas of magnetization transitions between saturated regions, a pulse width, a magnet gap length, and some other magnet's parameters. As result, the recording into very small bits is hampered.

A magnetic field created by two sheets of magnetic charge, positive and negative, at the medium surface, depends on many parameters of magnet and distances from the head surface. These fields are estimated in a very complicated way, for example, using the intricate approximation of Karlqvist.

To keep the record uniform and reversible as well as to avoid the media noise, which is created, for example, by an irreversible magnetization due to a hysteresis, special fields should be calculated, at which an irreversible switching of magnetization does not occur. (The switching field, or residual coercivity is a field, at which the magnetization switches irreversibly). These fields can be found using the complicated estimate of the Stoner-Wohlfarth model.

A complicated calculation of demagnetizing fields is necessary for an information readout. These calculations became even more complicated because, at the same time, demagnetizing fields oppose the magnetization and can destroy recorded patterns of magnetization. A vertical recording is also not "demagnetization-free".

The most substantial shortcoming of longitudinal recording is the superparamagnetic limit. It appears as a medium is scaling on very small particles and the magnetic energy per particle $K_U V$ (where the $K_U$ is the energy density of magnetic anisotropy and V is the particle volume) becomes comparable with a thermal energy $k_B T$ ($k_B$ is the Boltzmann's constant and T is the temperature in K). The probability of magnetization reversal is proportional to the ratio $\Delta E/k_B T$ ($\Delta E$ is the energy barrier) and leads to the time-reduced magnetization (or time-reduced coercivity), if $\Delta E \ll k_B T$.

To avoid above imperfections, several alternative approaches of magnetic recording were propounded.

One of the alternative approaches, a perpendicular recording, was created to overcome the physical barrier of superparamagnetic effect. It was supposed that the perpendicular recording would reduce demagnetization fields at high linear densities, allow to use the smaller field into writing head than the longitudinal one, and vertical bits will save space. It was also assumed that the medium would respond only to the vertical field.

For three decades, after a conception of the perpendicular recording has appeared (1975), the longitudinal recording is still more competitive (Piramanayagam, "Perpendicular Recording Media for Hard Disk Drives", Journal of Applied Physics, vol. 102, July 2007, pp. 011301-1-22). Some of shortcomings of the perpendicular recording are following:

The perpendicular recording requires bigger magnetic fields from a head. Fields should surpass the material coercivity by two or three times in order to reverse 50% of magnetization.

A soft underlayer or SUL (usually Permalloy) is too thick compared to the recording layer. This disadvantage leads to the problem of noise from the SUL because of the domain formation. An appearance of domain walls generates strong magnetic fields, which cause a strong noise during reading. A 180-degree magnetic wall of SUL will produce a signal (rather than noise). Other kinds of noise from the SUL are spike noise and stripe domains noise.

The perpendicular recording medium contains grains of the bigger size than in a case of longitudinal recording.

A combination of the single pole and SUL leads to erasure problems. A permalloy SUL acts as a flux antenna, channeling the magnetic flux from the spindle motor and actuator into a writing head. A stray field of 3 Oe is harmful for a drive. To avoid the flux influence, an additional shield for pole was added. However the additional shield may lead to an additional flux path (pole shield—SUL—reader shield). As a result, an erasure can appear over a wide area.

If the magnetically soft layer (SUL) and a hard layer (recording medium) are close to each other, their properties can be changed through the exchange interaction. This interaction can reduce the coercivity of the recording layer and produce a large noise during the readout. To reduce the interaction, an intermediate layer Ti90Cr10 should be introduced between them.

To improve properties of the recording media, contradictory requirements should be realized. The signal-to-noise ratio could be increased, if the size of magnetic grains for recording media is reduced. However this leads to a deterioration of the thermal stability factor. An improvement in the stability is connected with a growth of an anisotropy constant what causes an increase in coercivity and thus higher magnetic fields for write-heads (Hirotaka Shiino et al., "Characteristics of thermally assisted magnetic recording in granular perpendicular media", Journal of Applied Physics, vol. 105, July 2009, pp. 07B906-1-3).

To surmount the field and field-gradient limitations of conventional perpendicular recording, a conventional technology of so-called "heat assisted magnetic recording" (HAMR) is used (Gokemeijer et al., "Effect of Gradient Alignment in Heat Assisted Magnetic Recording", Journal of Applied Physics, vol. 105, July 2009, pp. 07B905-1-3). For recording medium, this method can utilize materials with a very high anisotropy. Heating reduces a switching field of the medium. Due to laser heating, the writing appears at smaller magnetic fields of the head than at the conventional writing.

The recording information in the above method is similar to the conventional magneto-optical (MO) recording. The MO recording comprises the thermomagnetic recording with a readout using magneto-optical effects (described, for example, by MacDonald et al., "Magneto-Optical Recording", Journal of Applied Physics, vol. 40, March 1969, pp. 1429-1435.

As shown, for example, in the paper by Tsunashima, "Magneto-Optical Recording", Journal of Physics D, vol. 34, September 2001, pp. R87-R102, the thermomagnetic recording technique includes following imperfections:

A laser energy is used as a heater, but not as a photon energy.

A speed of recording is determined by time of the medium temperature growth.

A recording time is also determined by the relaxation time of spin system near the Curie temperature.

A temperature profile of the medium heated by a laser beam spot (and thus recording densities) depends on thermal properties of medium and a thermal variation of magnetic properties of medium.

During a cooling process, domains appear along isotherm lines.

A thermal magnetic hysteresis of a magnetic permeability, which is caused by heating and cooling, irreversibly changes magnetic properties of the magnetic medium.

An increase in writing power, which is necessary at a desensitization of the media, leads to a degradation of the media and shortening a media lifetime.

An area heated by a laser illumination is much larger than a writing area of the head.

During the writing, an alignment of a thermal spot and magnetic field bubble is necessary. Latter complicates recording process and reduces recording speed.

A necessity of simultaneous usage of the magnetic field and an optical wave leads to a complex drive system.

At the same time, a magnetic film medium for the MO recording must satisfy many different physical conditions such, for example, as following:

The coercivity should be high and sharply reduced with heating.

MO effects should be large.

A magnetic anisotropy should be large and perpendicular to the film plain.

An optical absorption and a reflectivity should have enough high values.

To avoid the noise, the medium should be optically and magnetically homogeneous.

The medium should be thermally and chemically stable.

At all above requirements, the medium should be of low cost.

To satisfy numerous requirements for MO materials, the medium should be fabricated from multilayers (for example, four-layer structure) of amorphous alloys, consisting of the rare-earth Tb and transition-metal alloy Fe—Co. Expensive rare-earth metals, which should be doped with Cr and coated with Si—N layers from corrosion, complicate the fabrication and increase the cost of MO materials.

A readout of magneto-optically recorded marks is also very complicated and protracted process (Masahiko Kaneko, "Material for Magneto-Optical Recording", MRS Bulletin, vol. 31, April 2006, pp. 314-317). To read the recorded information, the MO recording system uses a MO Kerr effect. On reading information, a reflected linearly polarized light changes a polarization direction (as compared with that for incident light) only for one degree or even less. To increase a recorded marks resolution, different complicated methods are used. For example, during the readout, marks are extended in order to obtain a large signal. For this goal, the information, recorded as magnetic domains into the memory layer, is copied on the displacement layer through the exchange coupling between mutilayers. Then recorded marks, which become elliptical, are heated above the Curie temperature using a laser illumination. At that, the coercivity is reduced, because the exchange coupling does not work in a heated area, and domain walls move, until, they touch a contour of the Curie temperature in the switching layer, but domains should not move in the memory layer.

The prior art also discloses the so-called "All-optical magnetic recording", which was described, for example, in the paper by Stanciu et al., "All-Optical Magnetic Recording with Circularly Polarized Light", Physical Review Letters, Vol. 99, July 2007, pp. 04760-1-4. This prior art photo-induced magnetization appears on illumination of GdFeCo, an amorphous ferrimagnetic alloy, with the CPL from a Ti:sapphire pulsed laser with a pulse of 40 femtoseconds and a laser fluence of 11.4 mJcm$^{-2}$ (what corresponds to a light energy of about 2.85×10$^{11}$ Wcm$^{-2}$). The laser heats the recording medium until temperature close to the Curie temperature (500 K) and the CPL magnetizes it with the light induced effective field of 2T/mJcm$^{-2}$. The relaxation time of the OIM is in a range from 200 fs to 60 ps. An image of optically induced structures (the readout) was produced with a linearly polarized light (probe pulses) perhaps through the Faraday effect. The process is analogous to the heat-assisted recording and involves all described above drawbacks of medium heating (Tsunashima, "Magneto-Optical Recording", Journal of Physics D, vol. 34, September 2001, pp. R87-R102).

The utilization of the prior art "all-optical magnetic recording" in magnetic recording devices is very doubtful because the OIM appears at extreme conditions: an enormous laser energy of order of 10$^{11}$ Wcm$^{-2}$, high working temperatures (500K), and has the very low relaxation time (from 200 fs to 60 ps). After carrying out a number of heat-cooling operations, the recording medium will irreversibly change magnetic properties due to temperature magnetic hysteresis and become degraded chemically.

What is needed is a system and method providing a magnetic memory element with the unidirectional anisotropy, which can provide the hard bias for FM layers and memory cells for perpendicular recording using the room-temperature simple and cheap method, which can store the recorded information for the indefinitely long time. The described MOD with an optically induced magnetization responds to this need.

SUMMARY

A magneto-optical device (MOD) with an optically induced magnetization comprises a Mg—Mn—Co ferrite film deposited on a MgO substrate. On room-temperature illumination of the ferrite film surface with the circularly polarized light (CPL) at a static magnetic field (about 3 kOe), in the Faraday effect geometry (as the wave vector of light and magnetic field are normal to the ferrite film surface), at particular field-light combinations ("writing" combinations), the long-lived optically induced magnetization (OIM) with a unidirectional anisotropy appears. The MOD can be used as a hard magnet biasing (or exchange biasing) magnetic element (instead of conventional magnetic element) pinning the magnetization of a FM layer, for example, into read heads and into a microscopic tip of the MFM. The MOD can be magnetostatically coupled with the FM layer, but should be electrically insolated from the latter, for example, through the MgO substrate. The sensing current should not flow through the MOD.

The described structures, materials, and methods also provide utilization of the magneto-optical device as the magneto-optical memory cell for the magneto-optical (non-thermomagnetic) recording. The recording system with the MOD includes an electromagnet comprising a magnetically soft yoke with two poles, which create the field of about 3 kOe. Poles are parallel to the ferrite film surface. One of poles has a small opening for the laser beam. A current through a coil, wrapped around the yoke, magnetizes the magnet. The OIM occurred in the ferrite film during illumination in a magnetic field with "writing" field-light combinations represents a bit of recorded information. Recording is produced in a direction normal to the ferrite film surface (perpendicular recording). Two different magnetic states corresponding to the cases: illumination "Off" and "On" conform, respectively, to "1" and "0" in ferrite bits. The readout of information is carried out by a magnetic method measuring the bit remanence after (i) a subsequent ac demagnetization and (ii) a succeeding magnetization with a pulse of magnetic field, Hx, applied parallel to the ferrite film surface and subsequently reduced from about 40 Oe to zero. For two states, "1" and "0", the hysteresis loop will occupy two different positions along the Hx field. For the same applied field (for example, Hx=0), the remanence for the state "1" will have maximal value, and for the state "0" (with a shifted loop), it will be equal zero. The difference in remanences between two states "1" and "0" is about 100%. Erasing the information can be achieved on the illumination of the ferrite film with field-light combinations other than writing ("erasing" combinations) or by heating the ferrite film to temperatures not lesser than 530 degrees C., in a vacuum below 0.1 Torr.

The described structures, materials, and methods also provide a magnetic device, which essentially improves and simplifies the production of magnetic biasing elements pinning the magnetization of FM layers, for example, into magnetic field sensors (such as read heads and needles for the MFM), as well as recording and readout processes. The fabrication of MOD does not require multiple pairs of layers, which should be heated at high temperatures using strong magnetic fields to induce the magnetic unidirectional anisotropy. The optically induced unidirectional anisotropy with an indefinitely long relaxation time can stabilize magnetic moments in different directions without distortion of previously induced magnetic moments. Recording will appear at lower magnetic fields. A strong magnetic field gradient will not be required as well. The size of the recording head and the value of recording magnetic fields will be significantly reduced. The problem of transition sharpness will also disappear as well as a two-poles recording head with a SUL for the perpendicular recording what leads to double writing and different kinds of magnetic noise. An inexpensive only ferrite layer stable to a corrosion and temperature will replace the multilayered recording medium and make unnecessary using an expensive antiferromagnetic layer, which contains rare-earth metals and has a high electric resistance. The reduced number of layers will also decrease a sensing current and thus the working temperature of a read head. The temperature of the super-paramagnetic limit can be extended without any change in composition due to the optically induced increase in the Curie temperature of medium material. The room-temperature recording will reduce writing areas, which at thermally assisted recording and "All optical" magnetic recording, are inevitably enlarged with laser heating. The recording time for room-temperature recording will exclude an after heating relaxation time. The room-temperature recording is also free of the thermal magnetic hysteresis of the magnetic medium.

The MFM needle will be provided with reduced magnetic moment of better thermal and directional stability. In addition, the production costs of needles with a determined magnetic direction can be reduced. However for the MFM, the MOD can be used, if the force gradient is determined with other (than an ac resonant method) high-sensitivity sensors, for example, as an optical interferometer or tunneling sensor.

For the better understanding of the nature and advantages of the disclosed subject matter, the following detailed description with accompanying figures is presented.

BRIEF DESCRIPTION OF THE DRAWINGS

FIG. 3 is a diagram (simplified scheme) of a magneto-optical device (MOD) and system for its formation designed in accordance with a first embodiment.

FIG. 3.1 is a diagram of the magneto-optical device.

FIG. 3C demonstrates a hysteresis loop M-H for a non-illuminated ferrite film.

FIG. 3D shows the M-H curve after an illumination of the ferrite film with a sigma+ CPL.

FIG. 3E depicts the M-H curve after the illumination of the ferrite film with a H−, sigma+ combination.

FIG. 3F shows a bias of the M-H curve along the Hx-field axis, which appears after illumination of the ferrite film with a (H−, sigma−) combination.

FIG. 3G shows the M-H curve after the illumination of the ferrite film with a (H+, sigma+) combination.

FIG. 3H shows the M-H curve after the illumination of the ferrite film with a (H+, sigma−) combination.

FIG. 3I shows the M-H curve after the illumination of the ferrite film with a (H−, sigma+) combination.

DETAILED DESCRIPTION OF THE PREFERRED EMBODIMENTS

For magnetic recording heads, which write and read magnetic information, a biasing field (or a unidirectional anisotropy) is required in order to set a mutual perpendicular direction of magnetizations of first and second FM layers by fixing the magnetization direction of second FM layer. To achieve a unidirectional anisotropy, the prior art uses two approaches: (1) coupling a soft FM film with a permanent magnetic film and (2) a creation of a unidirectional anisotropy through an exchange interaction between an antiferromagnetic and ferromagnetic materials using heating above some critical temperature (about 300 degrees C.) with succeeding cooling in a high magnetic field (about 10 kOe) (Hempstead et al., U.S. Pat. No. 4,103,315). It is well known that a conventional exchange bias element with the unidirectional anisotropy works as the permanent magnet (Meiklejohn et al., "New Magnetic Anisotropy", Physical Review, vol. 102, No. 5, Jun. 1, 1956, pp. 1413-1414).

A conventional exchange bias phenomenon involving the unidirectional anisotropy occurs on the interface of two materials, ferromagnetic (FM) and antiferromagnetic (AFM), as a composite is cooled from the paramagnetic to the AFM state in a saturating magnetic field (about 10 kOe) aligned away of easy axis. For developing a unidirectional anisotropy, the prior art process of thermal magnetic annealing is also used.

Figure 1A:
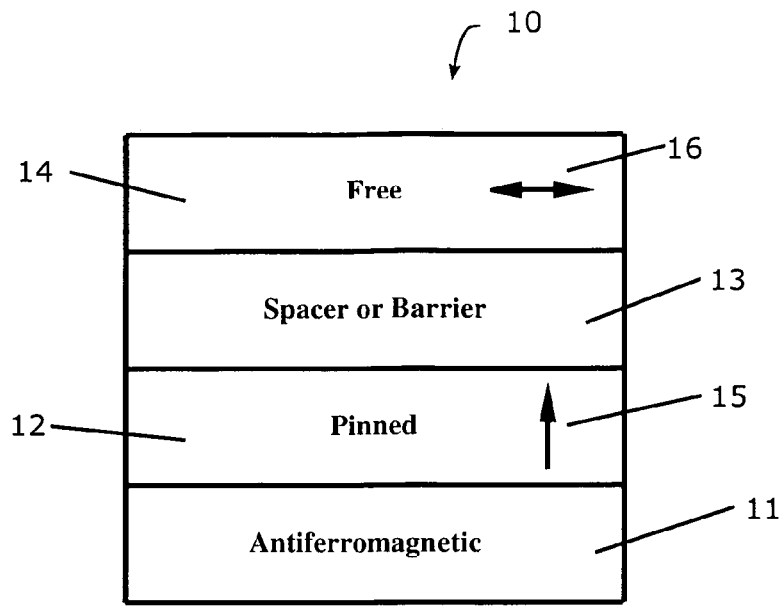
FIG. 1A is a diagram of the prior art conventional magnetic element, which is used, as a conventional spin valve or a conventional spin tunnelling junction into a read head.

Wang et al. (U.S. Pat. No. 7,230,845 B1) have described the prior art conventional MR read head based on a spin valve element (when the first and second thin film layers of a FM material are separated with a thin film layer of a non-magnetic metallic material what results in an enhanced MR effect). FIG. 1A depicts a simplified scheme of such read head 10. The read head comprises a conventional AFM layer 11, a conventional fixed FM layer 12 with magnetization 15, a conventional conductive nonmagnetic spacer layer 13, and a conventional free FM layer 14 with a magnetization 16, which can rotate in accordance with an external magnetic field. The composite of the AFM 11 and the FM 12 layers forms an exchange bias magnetic element, which is used for setting the direction of a magnetization 15 into the FM layer 12. The magnetic moment 15 is perpendicular both to the magnetic moment 16 of the free FM layer 14 and to the surface of magnetic medium (not shown). In read heads, the double spin valves are also used.

Figure 1B:
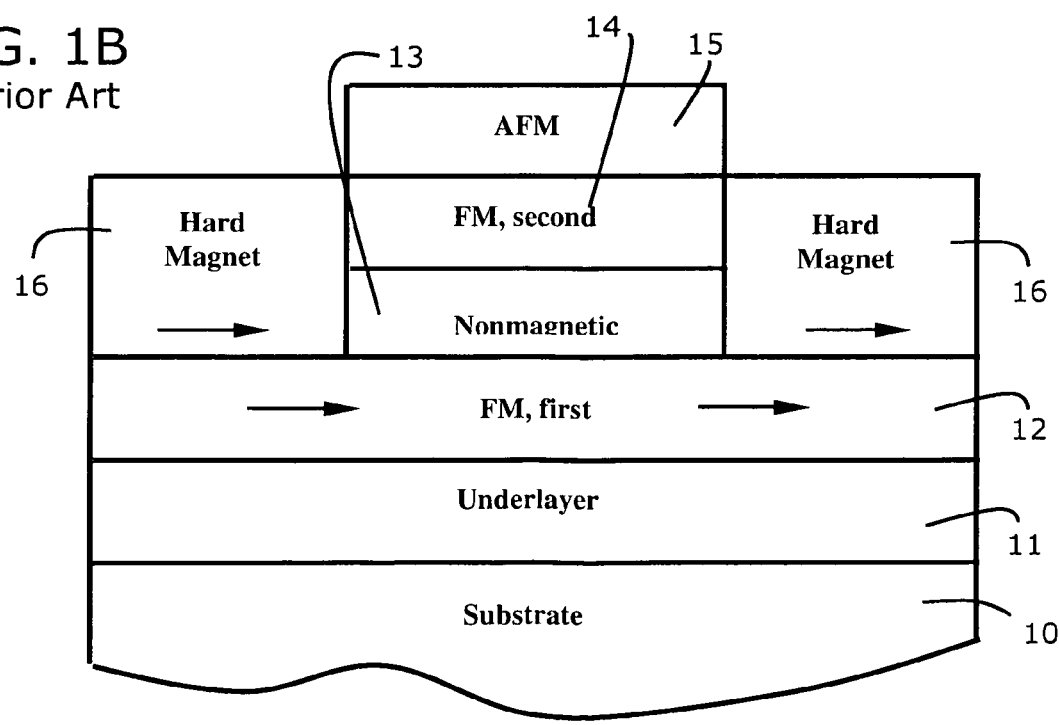
FIG. 1B is a diagram (simplified scheme) of the prior art conventional magnetoresistive sensor.

FIG. 1B shows a simplified scheme of a conventional MR sensor (Dieny et al., U.S. Pat. No. 5,206,590) where both an exchange bias magnetic element and a hard magnetic material are used for setting mutual perpendicular directions of magnetization into the first 12 (free) and the second 14 (fixed, with a fixed direction of magnetization, not shown) FM layers. The resistance of the magnetoresistive (MR) sensor varies with the angle between magnetizations of two layers and is independent of a current flow. For selected combinations of materials, the MR has a great value. The effect was termed as a spin-valve (SV) effect. The free layer 12 of the soft FM material is deposited on the substrate 10, after deposition of a conventional suitable underlayer 11. The longitudinal bias of the first FM layer 12 is produced using layers of a hard magnetic material 16 in order to orient the magnetization of the layer 12 in the direction of arrows. Instead of the layer 16, an AFM layer could be deposited. The first 12 and the second 14 FM layers with a conventional nonmagnetic metallic material 13 between them form the conventional SV element. The second FM layer 14, and the AFM layer 15 compose a conventional exchange bias element to fix the magnetization of the second FM layer 14.

The read head, which uses a spin tunnel junction as a MR element, is similar to that shown in FIG. 1A with a spin valve element. The magnetic tunnel junction device is described by Fontana, Jr. et al. (U.S. Pat. No. 5,729,410). A structure 10 with the spin tunnelling junction (instead of the conductive nonmagnetic layer 13) contains the conventional barrier layer. The layer is an electrically insulating material, which is thin enough for electrons to tunnel through.

FIG. 1B shows a prior art pinning magnetic element, which is based on a deposition of hard magnetic layers using high magnetic fields during deposition (Dieny et al., U.S. Pat. No. 5,206,590).

Figure 1C:
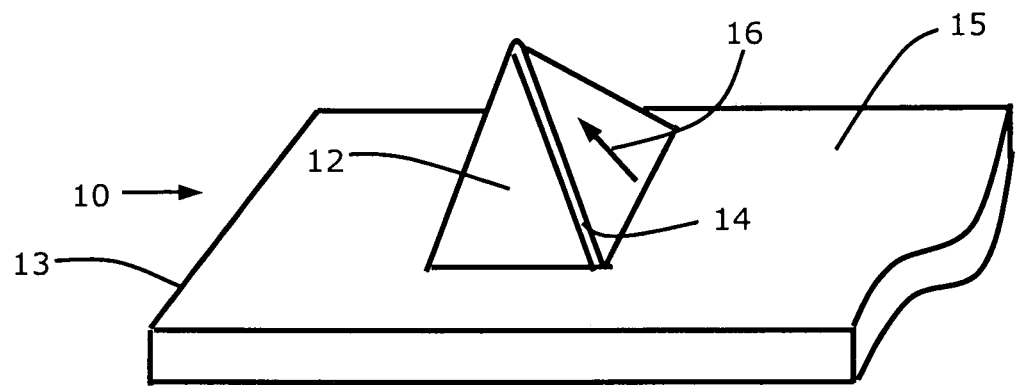
FIG. 1C is a perspective view of the prior art conventional cantilever with a microscopic needle having a stable magnetic moment and using for the magnetic force microscope (MFM).
Figure 1D:
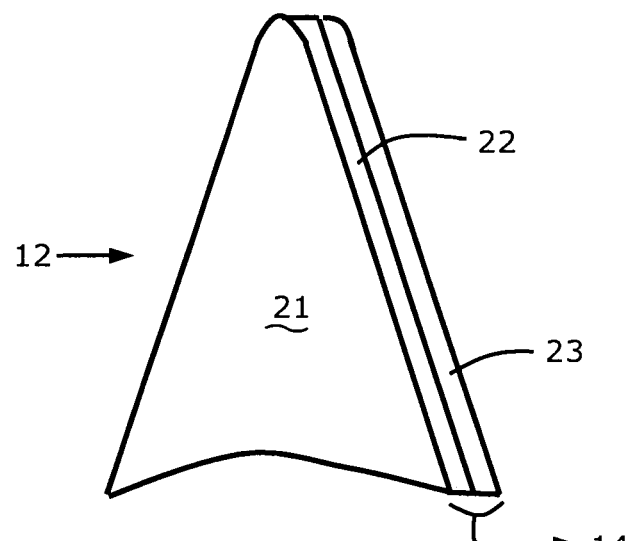
FIG. 1D is a cross-section of the prior art conventional tip of the needle of MFM shown in FIG. 1C.

FIG. 1C shows a simplified scheme of a prior art conventional magnetic force microscope (MFM) 10. The MFM comprises a conventional microscopic needle 12 disposed near a free end 13 of a cantilever 15. The needle contains a conventional exchange bias magnetic element 14, which formed of AFM and FM layers. An exchange bias interaction between these layers fixes the magnetic moment of the FM layer in the determined direction 16. The cantilever and needle supporting the magnetic element are usually formed of silicon and are commercially available. The needle has a tip, which is sharp and has a submicron radius of curvature. A cross-section of the needle 12 of FIG. 1C is depicted in FIG. 1D. A conventional silicon tip 21 has an AFM layer 22 and a hard magnetic layer 23 (with a thickness between 200 and 1000 Å) containing CoFe alloy and adjacent to the AFM layer 22. The hard magnetic layer 23 is magnetized in a desired direction by heating this layer with succeeding cooling in an applied magnetic field. The magnetic element 14 acquires the magnetic moment in the determined direction. The number of AFM and FM layers can be increased. The magnetic field at the tip may be in a range between about 10 Oe and 200 Oe.

Figure 2A:
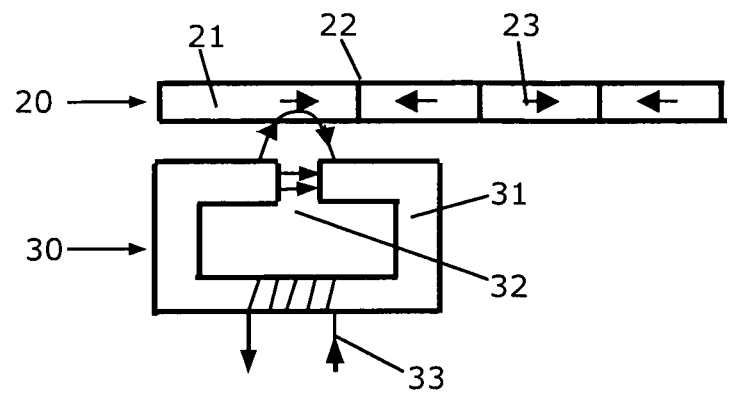
FIG. 2A is a schematic drawing of the prior art longitudinal magnetic recording system.

FIG. 2A shows a simplified scheme of a magnetic recording process. The recording medium 20 contains the magnetic patterns 21 with boundaries 22 between them. The magnetically stored information 23 represents a remanence with a fixed direction. A prior art write head 30 comprises an electromagnet, including the FM yoke 31 with a gap 32 located near the medium 20. A current passing through the conductor 33, which is wrapped around the FM yoke 31, magnetizes the yoke and bits of the disk 20 moving near the gap. The current contains information to be recorded on the disk 20.

Figure 2B:
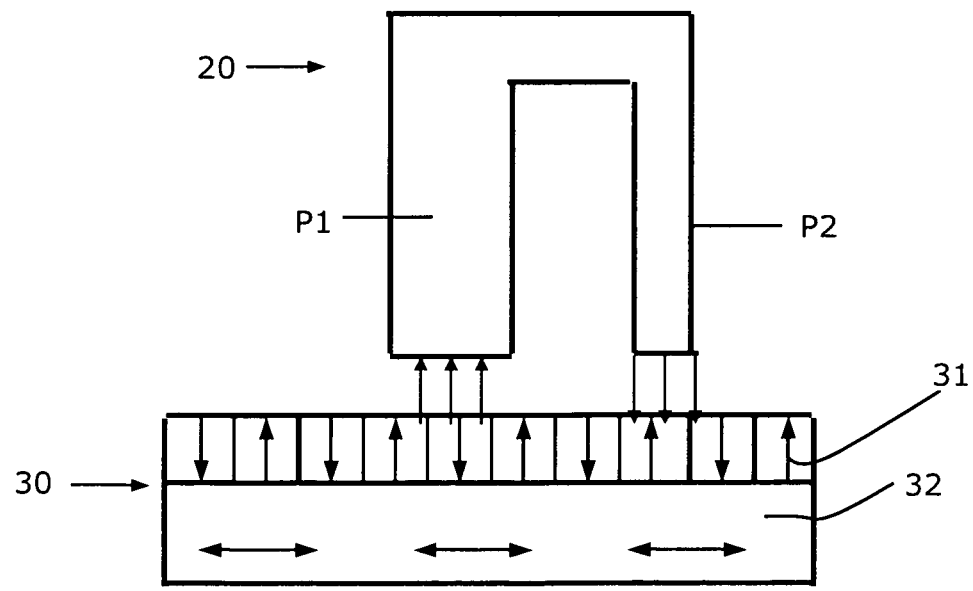
FIG. 2B is a schematic drawing of the prior art perpendicular magnetic recording system.

For the perpendicular recording, a writing process is depicted in FIG. 2B. A magnetic flux comes out of the write pole P2 and affects the bit of the perpendicular recording medium 30, which is immediately below. The vertically oriented medium 31, where the vertically magnetized bits are written, consists of the columnar grains with an easy axis perpendicular to the film plane. To reduce noise, the grains should be decoupled. An additional element for the vertical recording is a magnetically soft layer (so-called soft underlayer or SUL) 32 underneath the magnetic storage layer 31. The flux from the write pole P2 goes down through an area of vertical bit 31, the soft underlayer 32, and returns back to the auxiliary (or return) pole P1. A perpendicular field of the head records two peaks instead of one (Richter, "Recent Advances in the Recording Physics of Thin-film Media", Journal of Physics D: Applied Physics, vol. 32, August 1999, pp. R147-R168).

In the patent application, a new mechanism of production of the unidirectional anisotropy is established. This mechanism is based on formation of a long-lived room-temperature magnetization, which is optically induced due to the inverse Faraday effect (IFE). (The IEF is an appearance of an optically induced magnetization in a material on passing the CPL). The room-temperature inverse Faraday effect magnetization acquires the unidirectional anisotropy on illumination of a ferrimagnetic ferrite with the low intensity CPL at a saturated static magnetic field, in the Faraday effect geometry. The new method is simpler, faster, and cheaper than used for production of conventional exchange bias elements and conventional hard magnetic elements, which are utilized in magneto-resistive sensors and in the tip of the MFM needle. Disclosed in the patent application, a new mechanism of production of the long-lived unidirectional anisotropy leads to the room-temperature magneto-optical recording, which is significantly simpler and less expensive than the conventional longitudinal, perpendicular, magneto-optical (thermo-magnetic), and so-called "All Optical" recording.

According to our patent application, the magneto-optical element and its application will be described in three embodiments with a reference to the drawings.

First Embodiment

A first embodiment is shown in FIG. 3 and is generally designated therein by the reference numeral 100 and illustrates a method for producing a magneto-optical element with an optically induced magnetization or the magneto-optical device (MOD) with a unidirectional anisotropy at room temperature as well as a scheme of illumination at a magnetic field.

A system comprises an electromagnet, the MOD, and a system for illumination. The electromagnet contains a soft ferromagnetic yoke 102 with two poles, a gap 104 between the poles, and a conductor 106 wrapped around the yoke 102 as a coil or winding structure. An electrical current passing through conductor 106 creates a magnetic field H about of 3 kOe. The MOD comprises a Mg—Mn—Co— ferrite film 108 deposited on a MgO substrate 110. The MOD is located in the gap 104 between the poles, with the ferrite film 108 parallel to pole surfaces. The ferrite film 108 is illuminated through an opening 112 in one of the poles of the yoke 102. A beam 114 from a laser diode 116 (for example, with a wave length of 632.8 nm and a power of 4 mW) passing through a focal lens 118, a polarizer 120, and a quarter-wave plate 122 becomes circularly polarized. The laser beam falling upon the ferrite film 108 and the magnetic field H applied in the Faraday effect geometry (when the H-field is parallel to the wave vector k and normal to the film illuminatable surface) are switched "On" and "Off" in a following sequence: field "On"-light "On"-light "Off"-field "Off". The light creates in said ferrite film the long-lived optically induced magnetization (OIM) with a unidirectional anisotropy as the illumination combination H+, sigma+ or H−, sigma− is used. For simplicity, we ascribe the directions of H+ and H− fields as enforcing CPL helicities sigma+ and sigma− effects, respectively. An appearance time of the inverse Faraday magnetization is in a femtosecond interval (A. V. Kimel et al., "Ultrafast non-thermal control of magnetization by instantaneous photomagnetic pulses", Nature (London), Vol. 435, 2 Jun. 2005, pp. 655-657).

In FIG. 3.1, the magneto-optical device (MOD) is depicted. The MOD comprises the MgO substrate 110, onto the (100) plane of which an epitaxial ferrite film, preferably Mg0.75 Mn0.21Co0.04Fe2O4 ferrite 108 with the thickness about of 3.9 um deposited by a conventional chemical transport reaction. As shown in both FIG. 3 and FIG. 3.1, the ferrite film 108 includes a surface "F" that is subject to illumination by the circularly polarized light (CPL) from the light source 116. The ferrite is a spinel with the A[B]2O4 formula and Fd3 m space group. A and B ions are antiferromagnetically ordered, with a non-compensate magnetic moment. Ferrite films containing Co ions exhibit a uniaxial magnetocrystalline anisotropy with an easy axis along about [110] axis. At any of two field-light combinations H−, sigma− or H+, sigma+, in said ferrite film, the long-lived inverse Faraday effect magnetization (MIFE) with the unidirectional anisotropy appears. In FIG. 3 and FIG. 3.1, a dotted line (unnumbered) shows a boundary between said MgO substrate 110 and Mg—Mn—Co— ferrite film 108. While a Mg0.75 Mn0.21Co0.04Fe2O4 ferrite film 108 is preferred, films with Mg in a range of about 0.72 to about 0.78, Mn in a range of about 0.21 to about 0.19, Co in a range of about 0.04 to about 0.06, and Fe in a range of about 1.95 to about 2.05 molecular percents are suitable.

Table 1 shows an appearance of a optically induced perpendicular anisotropy in a ferrite film versus illumination regimes. The data result from our torque measurements of the remanence along the z-axis (x, y, and z axes are shown in FIG. 3.1) after ferrite was removed from the fields of 3 and −3 kOe. It is obvious that a sense and value of the remanence strongly depends on the illumination regime. For combinations (H−, sigma−) and (H+, sigma+), the unidirectional anisotropy appears. For opposite applied field directions, the magnitude of remanence changes about by 100%. It means that the ferrite film can be magnetized by the determined magnetic field in the only direction. As result, three different magnetic states can be obtained (1) |Mrz(+)|=|Mrz(−)|; (2) Mrz(+)=(Mrz) max, Mrz(−)=0; and (3) (Mrz(+)=0, Mrz(−)=−(Mrz) max.

The magnitude of remanences measured along z-axis (normal to the film surface) is by about 40 times smaller than that measured along x-axis (along the film surface). These results were disclosed in the digest by E. Z. Katsnelson et al., "Photomagnetic Effects Induced in Ferrites with Long-time Memory at Room Temperature", BF-04 IEEE International Magnetic Conference, Digests. Sacramento, Calif., May 4-8, 2009.

TABLE I

Remanences Mrz (+) and Mrz (−) measured along z-axis after the sample was removed from the field of +3 kOe or −3 kOe versus the illumination conditions

| Illumination | Mrz (+) mGcm3 | Mrz (−) mGcm3 |
| --- | --- | --- |
| After annealing | 1.23 | −1.25 |
| sigma+ | 0.4 | −0.85 |
| sigma− | 0.8 | −0.73 |
| H−, sigma+ | 0.55 | −0.98 |
| H−, sigma− | 0.95 | 0 |
| H+, sigma+ | 0 | −1.06 |
| H+, sigma− | −0.39 | −0.79 |

A difference in remanences along z or [001]-axis (normally to the film surface) and x or [100]-axis (along the film surface) can be explained by an analogy with the so-called perpendicular exchange bias phenomenon described by Nguyen N. Phuoc et al., in the paper "Perpendicular exchange bias mechanism in FePt/FeMn Multilayers", Journal of Applied Physics, vol. 101, May 2007, pp. 09E501-1-3. In the case of film material, two competing anisotropies exist: the perpendicular anisotropy, which aligns spins normal to the film surface, and the shape anisotropy, tending to align spins in plane. Since the shape anisotropy is stronger, than the perpendicular one, the ordering of AFM spins is stronger in parallel direction than in the perpendicular.

FIGS. 3A, 3B, 3C, 3D, 3E, 3F, 3G, 3H, and 3I demonstrate in-plane M-H hysteresis curves for the ferrite film. M-H curves were measured at room temperature with a SQUID magnetometer after different regimes of illumination. Results were described by E. Z. Katsnelson et al., in the paper "Photoinduced Bias of the Hysteresis Loop in Ferrites at Room Temperature with Long-time Memory", Journal of Magnetism and Magnetic Materials, vol. 321, No. 17, Sep. 1, 2009, pp. 2550-2555.

Figure 3A:
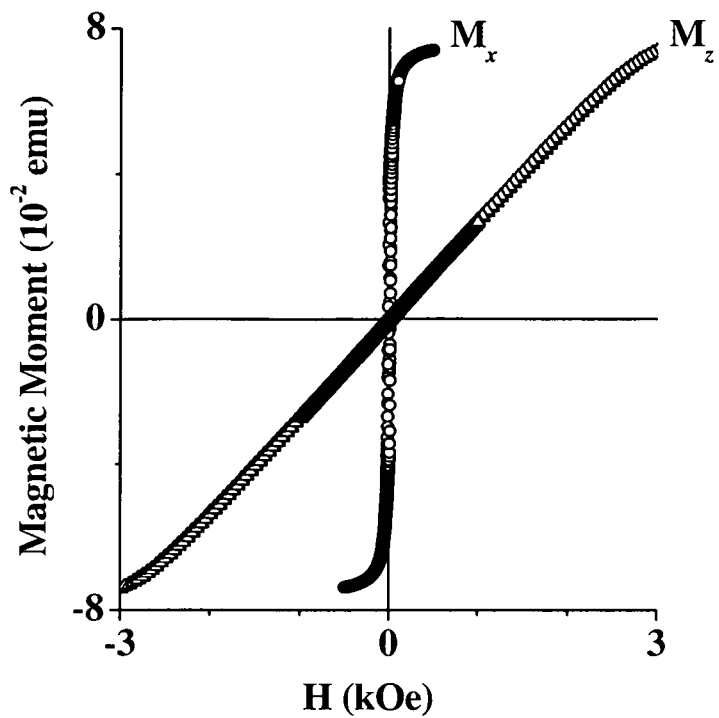
FIGS. 3A and 3B are related graphs, which depict the experimental results for room-temperature hysteresis curves with a magnetization measured along (Mx) and normal (Mz) to the film surface, respectively.
Figure 3B:
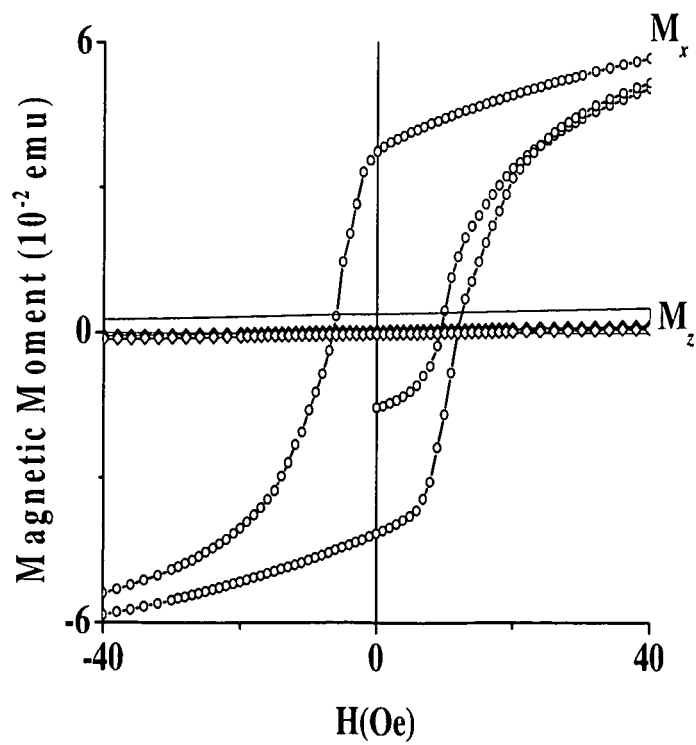

FIGS. 3A and 3B depict M-H magnetization curves measured along the direction of z-axis in a range from −3 to +3 kOe (FIG. 3A) and along x-axis in a range from −40 to +40 Oe (FIG. 3B). In accordance with the present invention, the case when a ferrite film is illuminated in the above geometry, and the hysteresis loop with the biasing field is measured in plane, along x or [100]− axis was selected for the practical application.

Figure 3C:
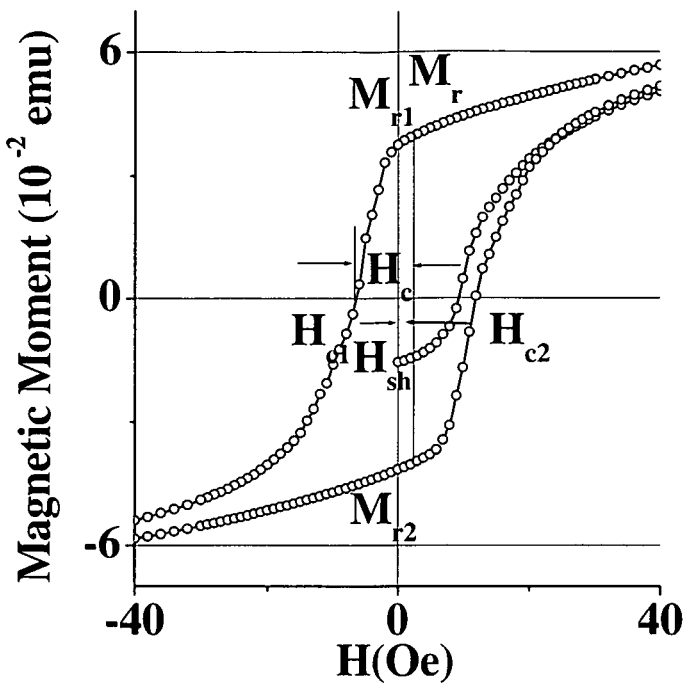
FIGS. 3C-3I are the related graphs, which depict the experimental results for the room-temperature hysteresis curves M-H measured versus illumination regimes (combination of a magnetic field H and a circularly polarized light with helicity sigma).

FIG. 3C demonstrates a usual for the non-illuminated ferrite film M-H hysteresis loop with a coercivities Hc1=−7 Oe and Hc2=12 Oe, and remanences Mr1=0.037emu and Mr2=−0.041 emu. Here Hc1 and Hc2 are coercivities and Mr1 and Mr2 are the remanences for applied fields Hx>0 and <0, respectively. In FIGS. 3A-3I, we denote the Hx as H. The coercivity Hc and a shift from the loop origin (Hx=0) Hsh are defined as in paper by J. Nogus et al., ("Exchange Bias", Journal of Magnetism and Magnetic Materials, vol. 192, No. 2, Feb. 15, 1999, pp. 203-232): Hc=½ (Hc2−Hc1) and Hsh=Hc+Hc1. For our non-illuminated ferrite film, the Hsh is negligible (2.5 Oe).

Figure 3D:
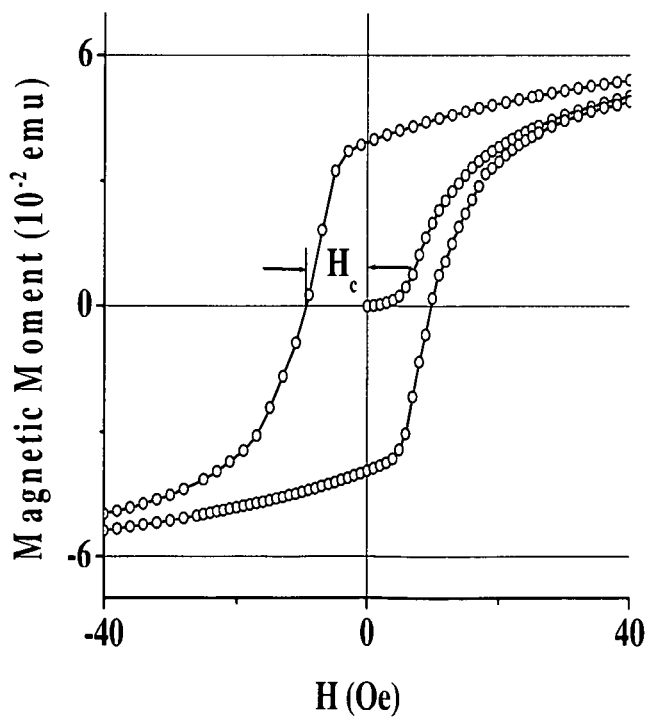

FIG. 3D shows the M-H curve after an illumination of the ferrite film with the sigma+ CPL, which causes the loop to become symmetric with a saturation magnetization Ms, reduced by 8%.

Figure 3E:
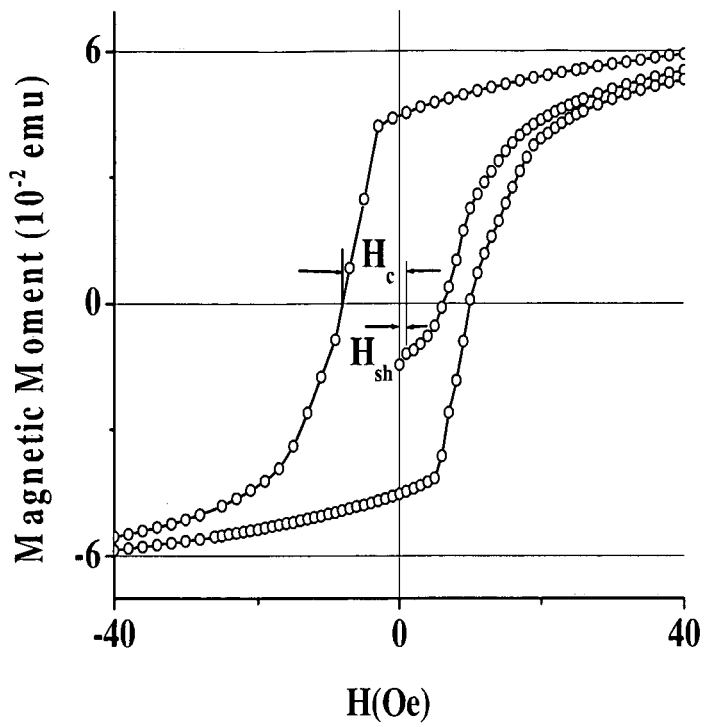

FIG. 3E depicts the M-H curve measured after the illumination of the ferrite film with a H−, sigma+ combination. The curve demonstrates an insignificant shift of the loop along the Hx-axis. The Ms-value increases by about of 8%.

Figure 3F:
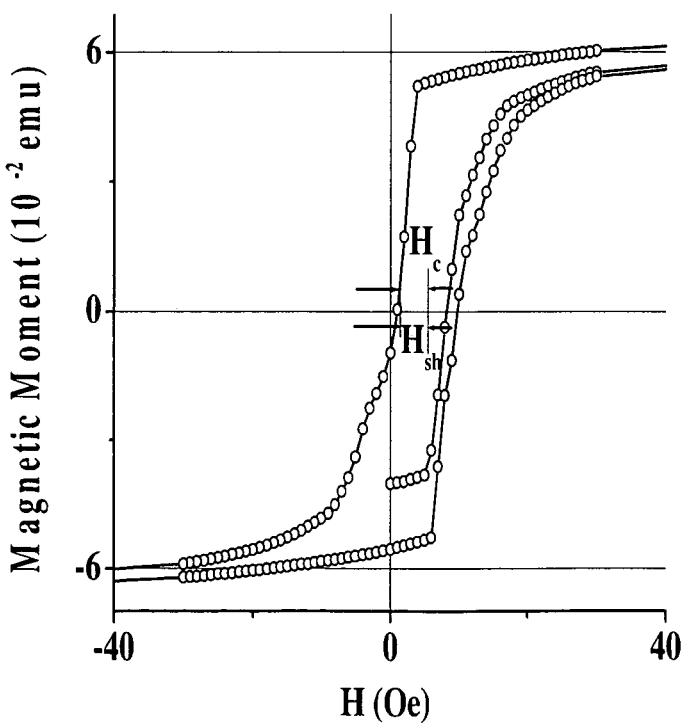

FIG. 3F shows a drastic shift (or biasing field) Hsh along the Hx-field axis for the M-H curve, which appears after (H−, sigma−)-illumination of the ferrite film. The loop contracts by a factor of two. The shift of the mid-point of the loop increases by approximately five times, surpassing the coercivity Hc. The magnitude of Hc1 changes by 9 Oe (111%) and reverses sign. The remanence Mr, corresponding to the Hsh-field, increases about 18%, the Mr1 reverses sign and decreases by a factor of 4.5, and the Mr2 increases by about 24%. A rectangularity of the loop is improved to a considerable extent. The hysteresis loop shift is usually connected with an appearance of the unidirectional anisotropy.

Figure 3G:
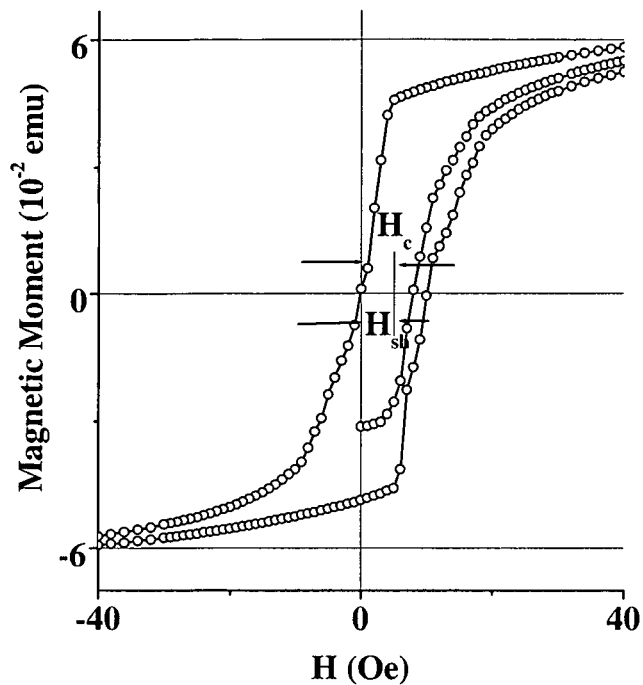

FIG. 3G demonstrates that a (H+, sigma+)-illumination reproduces the effect of a (H−, sigma−) illumination on the M-H loop within 10%. The loop is stable with respect to remagnetizations. The shift in the loop was preserved for at least a week.

Figure 3H:
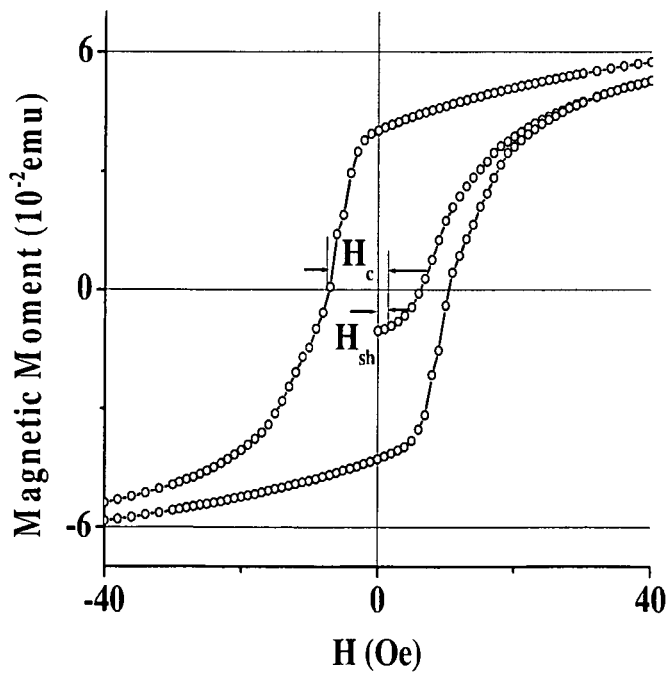

FIG. 3H shows that after an illumination with (H+, sigma−) combination, the M-H loop for the ferrite film expands nearly two times and (after six demagnetizations) becomes almost symmetric with coercivities Hc1=−7 Oe and Hc2=10 Oe, and remanences Mr1=0.04 emu and Mr2=−0.043 emu.

Figure 3I:
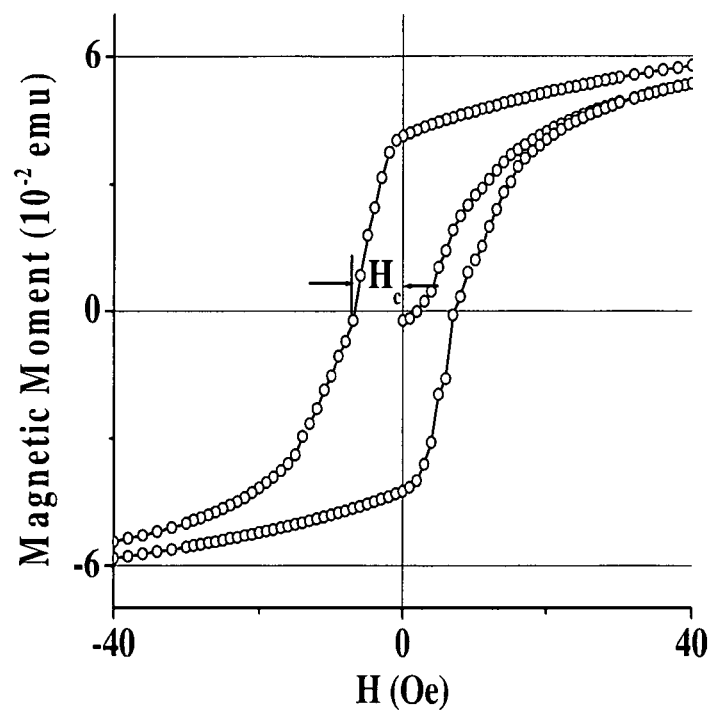

FIG. 3I depicts effect of a (H−, sigma+)-illumination on the M-H curve for the ferrite film, which leads to a symmetrical loop with coercivities Hc1=−7 Oe and Hc2=7 Oe, and remanences Mr1=0.041 emu, Mr2=−0.042 emu.

FIGS. 3H and 3I show that illumination of the ferrite film with combinations (H+, sigma−) and (H−, sigma+) can erase the recorded OIM. The repeated H+, sigma+-illumination again strongly shifts the loop. However after three successive repetitions, the shifted loop became stable and could not be restored to a symmetrical form with subsequent (H+, sigma−) and (H−, sigma+)-illuminations.

This patent application describes in the context of current knowledge for physical phenomena involving the optically induced magnetism.

New magneto-optical device, which we describe, is based on optically induced magnetic phenomena. Strong support for the optical nature of new phenomena is provided by the dependence on the light polarization. Applied during illumination the saturating magnetic field H=3 kOe causes Weiss domains (described in the book by S. Chikazumi, "Physics of Ferromagnetism", 2nd Ed., 1997, Clarendon Press-Oxford, pp. 118, 119) to vanish and makes the optically induced effect cooperative.

On the other hand, the new effects observed—a biased hysteresis loop and a change in loop parameters—are usually attributed to the exchange bias phenomenon. It is very likely, that new effects are caused by an exchange anisotropy induced by illumination.

In magnetic materials, as a result of a optically induced change in both the electronic and magnetic structure, photoelectrons trapped on local defect levels can alter the exchange interaction and anisotropy energy (in the defect's vicinity) and, in turn, induce domain wall motion and affect the long-range magnetic order. In addition, in this region, antiferromagnetic materials can be driven into a metastable ferromagnetic state through an optically induced local phase transition (Nagaev, "Photoinduced Magnetism and Conduction Electrons in Magnetic Semiconductors", Physica Status Solidi, vol. 145B, No. 1, January 1988, pp. 21-23). Ferromagnetic regions surrounded with an antiferromagnetic matrix form two magnetic phases with a surface between them. On this surface, an exchange interaction with an exchange anisotropy might arise.

In the ferrite film, the optically induced unidirectional anisotropy can occur due to an appearance of the optically induced static magnetic field MIFE (the inverse Faraday effects magnetization) during an illumination with the CPL [the so-called inverse Faraday effect (IFE)]. This effect was described in details by Pershan et al., "Theoretical Discussion of the Inverse Faraday Effect, Raman Scattering, and Related Phenomena", Physical Review, vol. 143, No. 2, March 1966, pp. 514-583. In ferrite film, the MIFE occurs at the room temperature during the CPL-illumination along the wave vector k. The unique direction of the MIFE magnetization is determined by the CPL helicity. For the ferrimagnetic ferrite film, the magnetic moment corresponding to the MIFE and experimentally estimated by us is about $1 \times 10(-4)$ Gcm3.

For two combinations of the H-field with CPL helicity: (H+, sigma+) and (H−, sigma−), the OIM forms a long-lived magnetic state, which results in the displacement of the hysteresis loop with a change in loop parameters for an indefinitely long time. The loop shift is usually connected with the unidirectional anisotropy. The optically induced loop shift cannot be erased by conventional ac demagnetization. The indefinitely long relaxation time of the OIM was explained by an existence (in the ferrite magnetic material) of localized states or traps, or defects trapping non-equilibrium charge carriers of only sign and thus hindering their recombination. Described above localized magnetic states were called as magnetic polarons (Nagaev, "Photoinduced Magnetism and Conduction Electrons in Magnetic Semiconductors", Physica Status Solidi, vol. 145B, No. 1, January 1988, pp. 21-23).

In ferrite materials, the forbidden gap is wide, so traps can be deep and preserve photoelectrons at enough high temperatures. Moreover charge carriers in ferrites are small radius polarons with a low mobility of $10(-2)$ cm2Vsec, which exponentially grows with temperature, already localized at room temperature. Captured photoelectrons can be localized for a long time and affect magnetic properties through an exchange interaction.

The OIM can be erased either utilizing two field-light combinations (H+, sigma−) and (H−, sigma+) or using the heating of ferrite film at temperature of about 530 degrees C. (which is much higher than the Curie temperature Tc=390 degrees C. for non-illuminated ferrite) in the vacuum about of 0.1 Torr.

For a particular ferrite composition, the value of remanence and the shift field Hsh can be increased, if the ferrite film is magnetized along the [110] easy axis. A change in ferrite parameters can be also provided altering the ratio of Co— and Mn-ions for the ferrite composition. A determined value of biasing field might be achieved by tuning a thickness of a ferrite film.

An appearance of the unidirectional anisotropy in the ferrite film can be controlled using two independent methods. After the conventional demagnetization (with an ac current with an amplitude reducing to zero) normally to the film surface, or along z-axis, the ferrite film should be: (i) successively removed from magnetic fields of 3 and −3 kOe, which are normal to the ferrite film surface (or aligned along z-axis) and remanences should be measured. The ratio between the remanences Mrz (+) and Mrz (−) will show the presence or absence of the unidirectional anisotropy (see Table 1); (ii) magnetized in-plane (along the x-axis) with a Hx-field pulse, which is reduced from about of 40 Oe to zero. The shift of the M-H curve along the Hx-field away from Hx=0 with a change in the sense of residual magnetization Mr1 and the reduction of its magnitude from the maximal value of 0.037 emu (for the non-illuminated ferrite film) to about zero (for the illuminated ferrite film) will demonstrate the presence of the unidirectional anisotropy. In the patent application, these values can be also used for an estimation of the SNR.

Illumination regimes, at which the unidirectional anisotropy appears, coincide for both methods of measurements.

The patent application foresees that a deposition of an epitaxial ferrite film can be made by any technique, for example, described below:

A chemical transport reaction disclosed in the paper by Katsnelson et al., "Photomagnetization of ferrite films and its effect on optical spectra", Physica Status Solidi, vol. 111 A, January 1989, pp. K233-K236.

A molecular beam epitaxy (MBE) described by Wolf et al. in "MBE Growth of CoO and Fe3O4 films and CoO/Fe3O4 multilayers", Materials Research Society Symposium Proceedings, vol. 341, 1994, pp. 23-28.

A "one solution spray technique" using an aqueous solution described by Subramani et al., "A simple process for ferrite film preparation from one solution without using hazardous oxidizing agent", Journal of Applied Physics, vol. 101, May 2007, pp. 09M504-1-3. Ferrite films have a good crystallinity and can be fabricated at 90 degrees C., without following annealing.

A pulsed laser deposition using KrF laser (248 nm) with an energy density of about 2 J/cm2 at room temperature in vacuum (10-6 torr) is described by Bettinger et al., "Room Temperature Photoinduced Magnetization of Manganese Zinc Ferrite", Applied Physics Letters", vol. 94, February 2009, pp. 072505-1-3.

Second Embodiment

Figure 4:
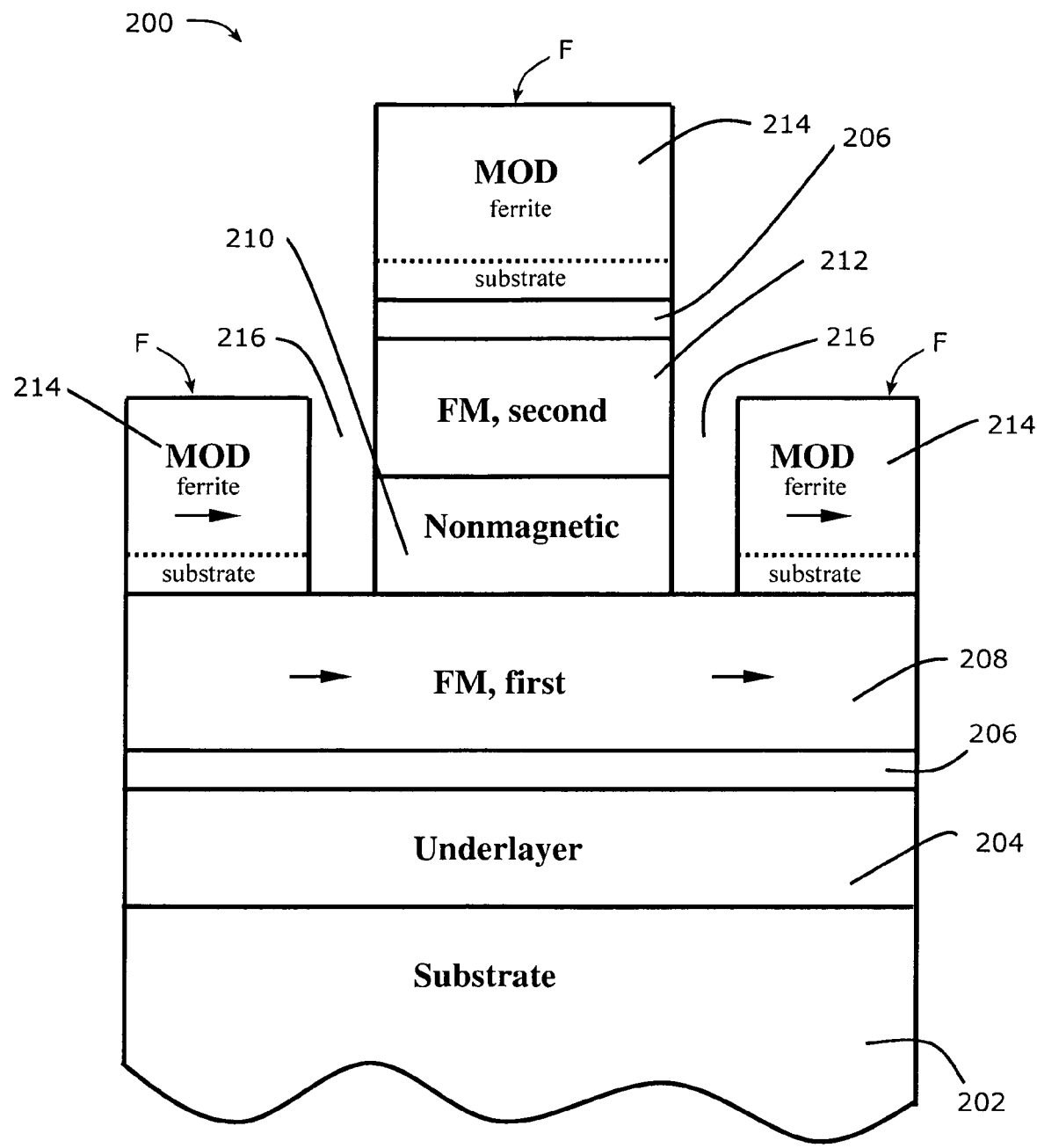
FIG. 4 is a diagram (simplified scheme) of the magneto-resistive sensor with a magneto-optical device (MOD) created according to a second embodiment.

A second embodiment is shown in FIG. 4 and is generally designated therein by the reference numeral 200. As shown, the magneto-optical device 200 with the optically induced magnetization in the ferrimagnetic ferrite film can be used as a biasing or pinning magnetization (of FM layers) element in magnetoresistive read heads and in a tip of a needle of the magnetic force microscope (MFM) using the optically induced magnetization (OIM), which is stable to a conventional ac demagnetization and has an indefinitely long relaxation time.

FIG. 4 shows a simplified scheme of the magneto-resistive sensor, which is improved by using the magneto-optical device (MOD) in accordance with the second embodiment. The MOD can replace elements pinning magnetization of FM layers, for example, in a conventional MR sensor, shown in FIG. 1B (also described by Dieny et al. in U.S. Pat. No. 5,206,590 and shown in FIG. 5 herein). In FIG. 1B, the MOD can replace antiferromagnetic layer 15 (which forms an exchange bias element with a second FM layer) and hard magnetic layers 16 (which fix a magnetization direction of the first FM layer) to provide the structural arrangement of FIG. 4.

The improved magnetoresistive sensor comprises a substrate 202, an underlayer 204, electrical leads 206, a first FM layer 208, a nonmagnetic layer 210, a second FM layer 212, and MODs 214 each having a Mg—Mn—Co-ferrite coating having the composition described above and overlying a MgO substrate. The MOD 214 will fix direction of the magnetic moment in the first 208 and second 212 FM layers using a magnetostatic interaction between a ferrite film and FM layers. This arrangement will essentially simplify and reduce the time of setting magnetic moments of the first 208 and second 212 FM layers, as magnetic moments should be substantially perpendicular to each other. If the substrate has a sufficiently high resistivity, a planar surface, and a suitable crystallographic structure, the underlayer 204 can be omitted (Dieny et al., U.S. Pat. No. 5,206,590).

MODs 214 are electrically insulated from FM layers 208 and 212 by MgO substrates and from the nonmagnetic layer 210 by either air gaps or electrical insulating layers 216. A sense current (of the MR sensor) should not pass through MODs.

MODs 214 can be fabricated separately and then affixed by any room-temperature glue to the surface of the first 208 and second 212 FM layers from a side of the MgO substrate (a dashed line shows a separation between the ferrite film and the substrate). The sense current and its heating effect will be reduced due to a removal of the AFM layer usually with a high resistance and a lesser total number of layers between electrical leads. According to another embodiment, MOD elements 214 (the MgO substrate and the Mg—Mn—Co ferrite film) can be deposited on the first FM layer 208 and on the electrical lead 206, which coats the second FM layer 212. Then the Mg—Mn—Co-ferrite film of the MOD 214 could be illuminated with the CPL (a diameter of a laser beam is about of 1 mm$^2$) in the magnetic field H about of 3 kOe with the (H−, sigma−) or the (H+, sigma+) combination. The wave vector k of the CPL and H should be normal to the ferrite film illuminatable surface.

Manufactured with any of above-mentioned technology, the MOD 214 will be magnetostatically coupled with FM layers 208 and 212. In these layers, the MOD 214 will produce a magnetic moment parallel to the preferential direction of the ferrite easy axis [110]. The arrows show these directions.

The following example illustrates a practical application of the disclosed subject matter.

The ferrite film (with a size of 1.029×0.638×3.9×10−5 cm3 and a volume equal to 2.56×10−5 cm3) and having the composition described above was illuminated with the (H−, sigma−) combination in the field of 3 kOe normal to the ferrite film surface (along z-axis) and then ac demagnetized in the same direction. After succeeding magnetization along the x-axis [100] with a pulse of a magnetic field reducing from the 40 Oe to zero, the ferrite film has the remanence about of 0.055 emu or 214 emu/cm3 and the coercivity Hc2 of 10 Oe (FIG. 3F). If the ferrite film is magnetized along the easy axis [110], the remanence will be equal to 0.077 emu or 301 emu/cm3. This value of magnetization has the same order as the value of that currently used in the conventional read head. For example, the residual magnetization of the hard magnetic layer used by Furukava et al. in U.S. Pat. No. 7,243,412 for biasing the ferromagnetic layer is in a range of approximately from 300 to 700 emu/cm3.

The thickness of the ferrite film should be selected in such way that the product Mr×t for the ferrite film, where Mr is the residual magnetization and t is the thickness of the ferrite film, to be equal or larger than a product $Ms_F \times t_F$ for the FM layer of the read head where $Ms_F$ is a saturation magnetization and $t_F$ is a thickness. For example, in above U.S. patent (Furukava et al.), the saturation magnetization $Ms_F$ of the FM layer was in a range from 800 to 1300 emu/cm3, and the thickness of hard magnetic layers was much bigger than the thickness of the FM layer. The thickness of ferrite film can be also selected bigger than that for the FM layer.

At higher recording densities with a smaller size of bit, the remanence value should be reduced as well. Using the MOD, the magnetic field of the sensing layer (into the magnetic sensor) can be reduced. During the readout, an interaction between low magnetic fields of the sensor and medium bit will become linear and reversible. Moreover at low magnetic fields of the medium, its residual magnetization will not be changed by the smaller magnetic field of the sensor.

Figure 5:
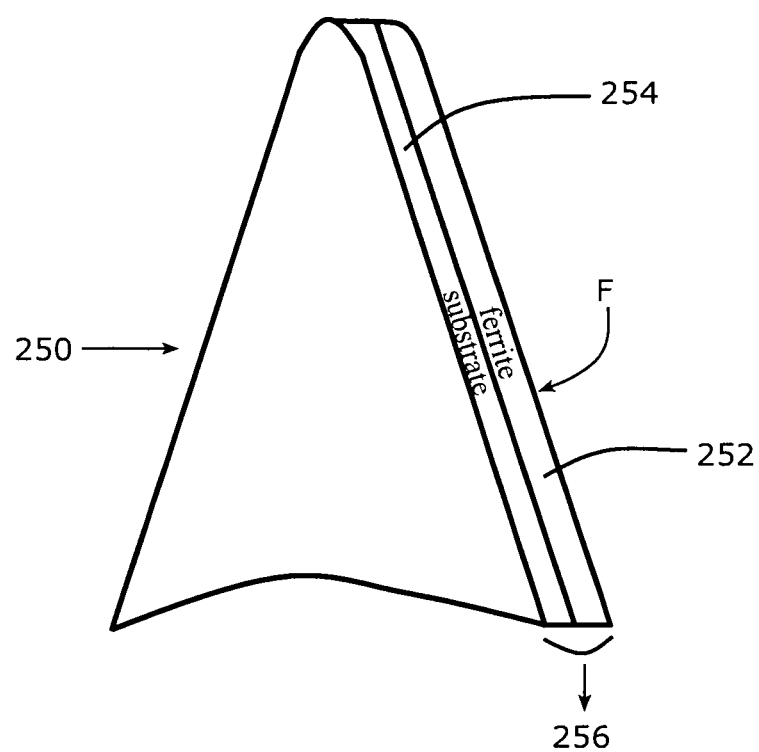
FIG. 5 is a view of a tip of a MFM needle with the MOD.

The MOD can be also used as a pinning magnetic element for the tip of the needle into the magnetic force microscope (MFM). In accordance with the second embodiment, the MOD can be used to improve tip of the needle of the MFM. FIG. 5 shows a simplified structure of a MFM needle and is designated generally therein by the reference character 250; the MFM needle 250 corresponds generally to that shown in FIG. 1D but utilizes the MOD disclosed herein. The Mg—Mn—Co-ferrite film 252 deposited on the MgO substrate 254 can replace both the AFM layer 22 and the FM layer 23 shown in FIG. 1D for a conventional tip of the needle described, for example, by Chen et al., U.S. Pat. No. 6,448,765, and the MOD 256 can be used instead of a conventional exchange bias element 14. The MOD 256 can be deposited on (or affixed with the room-temperature glue thereto) the silicon tip 21 of FIG. 1D. The magnetic moment with a determined direction can be induced into the MOD 256 (as well as into the MOD 214 in FIG. 4) either before or after affixing. The ferrite film surface F can be illuminated with a particular H, sigma combination in the direction normal to the ferrite film surface. After conventional ac demagnetization in the same (normal to the surface) direction and magnetization with a low (about 40 Oe) in-plane field, the element, pinning magnetic moment, can be used for the tip of the MFM needle.

The second embodiment of our patent application will provide the MFM needle with the magnetic moment of much better stability (thermal and directional) and reduced magnitude. The improved magnetic needle includes instead of two (FM and AFM), the only magnetic layer of the ferrite. The stabilization of the direction of magnetic field in this layer is ensured due to an optically induced unidirectional anisotropy appeared at room temperature in a faster and cheaper way than that obtained with the conventional exchange bias element. Used for the MR or GMR sensor, the MFM needle with a reduced magnetic moment can prevent the saturation of the MR or GMR sensor, which can occur from the needle, and thus increase a resolution in mapping. A needle with a smaller, but more stable magnetic moment can be disposed closer to the mapping magnetic element without reversing the magnetic moment of the needle. However at that in the MFM, the ac detection method, which determines the force gradient using a shift of the resonance frequency for an oscillating cantilever, should not be used. Acoustic waves, which stimulate cantilever oscillations, can cause a magnetostriction in the ferrite film. The effect of latter on the OIM was not yet studied. Therefore the MOD can be used for the magnetic force microscope, if the force gradient is determined with other method of high sensitivity, for example, such as an optical interferometer or tunneling sensor.

Third Embodiment

A method and system for magneto-optical recording using the MOD as a memory cell is presented in a third embodiment.

Figure 6:
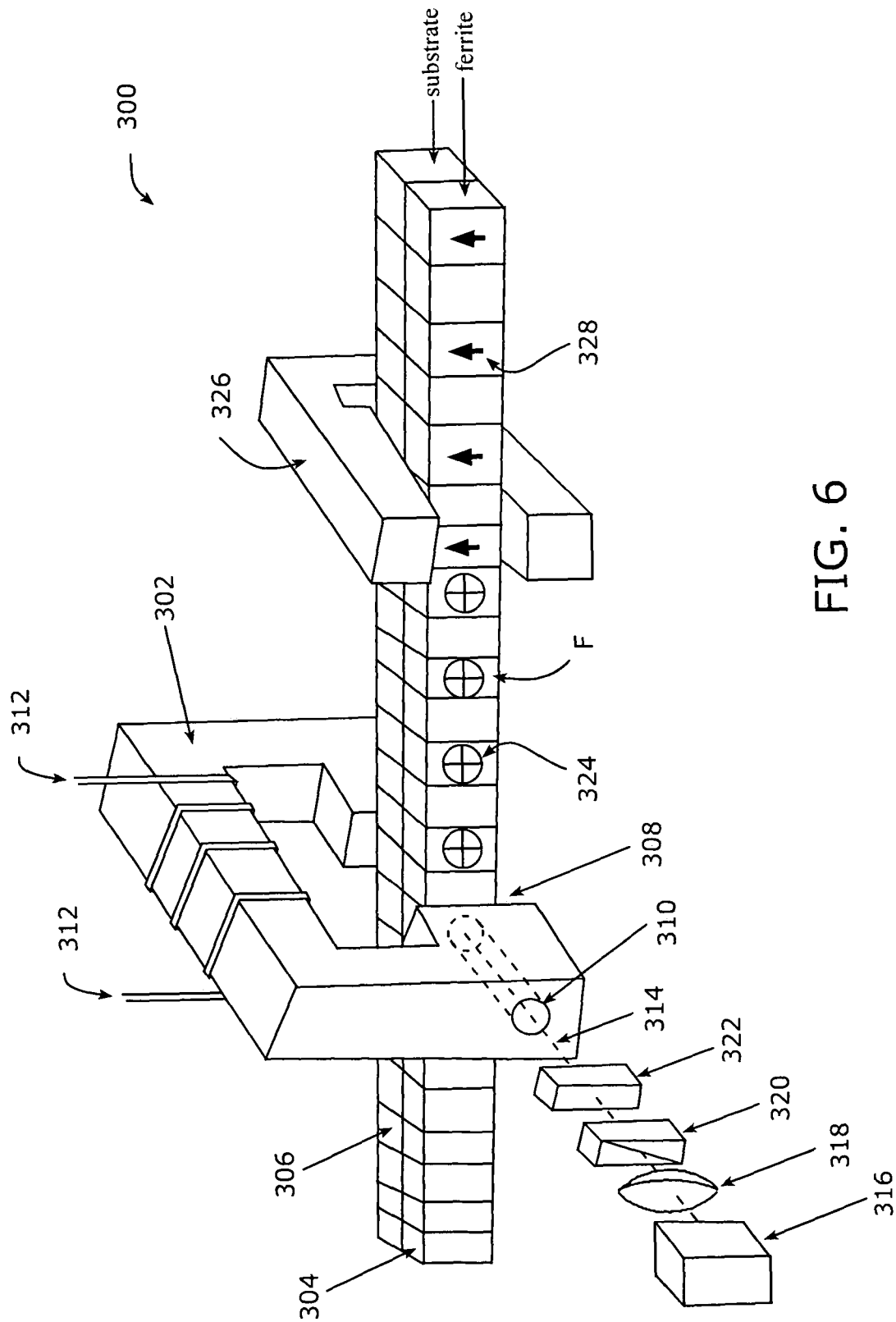
FIG. 6 is a perspective view (simplified scheme) of the magneto-optical recording and readout systems designed in accordance with a third embodiment.

FIG. 6 shows a simplified scheme of a magneto-optical recording system designed in accordance with the third embodiment and is generally designated therein by the reference numeral 300. As shown, the system comprises a soft FM yoke 302 with two poles, the MOD, which is used as a recording medium with a patterned Mg—Mn—Co-ferrite film 304 deposited on the MgO substrate 306, which can be part of a disk structure. As the disk with the recording medium moves through a gap 308, a portion of the surface F of the ferrite film 304 is illuminated through an opening 310 in one of the poles (unnumbered) of the yoke 302. A conductor 312 is wrapped around the yoke 302 to form a coil or winding structure. A current, passing through conductor 312, creates the magnetic field H about of 3 kOe. A laser beam 314 from a laser diode 316 (for example, with a wave length of 632.8 nm and a power of 4 mW), passing through a focal lens 318, a polarizer 320, and a quarter-wave plate 322, becomes circularly polarized. The laser beam 314 falling upon the surface F of the ferrite film 304 and an applied magnetic field H should be switched "On" and "Off" in a following sequence: field "On"-light "On"-light "Off"-field "Off". In all material, the optically induced magnetization (OIM), called as inverse Faraday effect magnetization (MIFE), appears within a femtosecond time interval (A. V. Kimel et al., "Ultrafast non-thermal control of magnetization by instantaneous photo-magnetic pulses", Nature (London), Vol. 435, 2 Jun. 2005, pp. 655-657). In the ferrite film 304, the CPL creates the OIM with the unidirectional anisotropy and an indefinitely long relaxation time. For recording information, "writing" field-light combination H+, sigma+ or H−, sigma− is used. A residual OIM, remained after illumination, represents a bit of the recorded information. Two different magnetic states corresponding to cases with the illumination "Off" and "On" conform, respectively, to "one" and "zero" recorded marks.

The size of the bit should be larger than a superparamagnetic size limit for the ferrite material, which is in a range about from 15 to 30 nm. The temperature superparamagnetic limit of the ferrite film is appeared significantly increased due to the optically induced increase in the Curie temperature by 140 degrees C.

The recording time is also determined by a remagnetization process, which depends on the magnetic viscosity of a ferrite material and appears to be of 10-9 s.

A readout of recorded information can be provided in two methods: (1) utilizing an optically induced shift of hysteresis loop after two following operations: (i) a conventional demagnetization of the ferrite film using an ac current with an amplitude reducing the demagnetizing field H, which is normal to the ferrite film surface F, from 3.5 kOe to zero; (ii) a magnetization of the ferrite film in-plane, along an easy axis [110], disposed on the film surface (or along x-axis) with a pulse of a magnetic field reducing from 40 Oe to zero. The bit remanence is measured with a conventional method using the conventional read head or the MFM. The remanence is maximal for the state "one" and is about zero for the state "zero".

FIG. 6 schematically shows the process of the readout of recorded information for method (1). The remanence of the OIM, or the MIFE, 324 appears in the ferrite film 304 in the first direction normal to the film surface F. After a conventional ac demagnetization of the film between poles of the yoke 302, along the first direction 324 (or z-axis), the ferrite film 304 passes through the gap of a second magnet 326, which magnetizes said ferrite film in the second direction 328 along the ferrite film surface F, or along x-axis, with a pulse of magnetic field Hx, which is reduced from about 40 Oe to zero.

As a result of the optically induced bias, the hysteresis loop of the optically magnetized ferrite film shifts. The remanence of the non-illuminated bit will have maximal value, as for an illuminated bit, at the same applied field Hx=0, the bit remanence will be about zero.

The following examples show the opportunities for the practical utilization of the patent application using two foregoing readout cases of the remanence.

Case 1. According to our experimental data for the preliminary annealed at 530 degrees C. non-illuminated ferrite film, the remanence is equal to 0.0374 emu.

After the ferrite film is illuminated with the field-light combination H−, sigma−, the hysteresis loop is shifted and the remanence at the same field (for example, Hx=0) became equal to 0.0097 emu, i.e. about by four times less. For Hx=1 Oe, the ratio between remanences for marks "one" and "zero" became equal to 96.

This value can also be used for the estimation of the signal-to-noise ratio. A conventional read head or the MFM can easily distinguish these two states.

Case 2. The readout of recorded information can be also provided using the second method: measuring the residual magnetization of the bits after said ferrite film magnetization with the field of 3 and −3 kOe normal to the illuminatable surface or along the first direction, or along z-axis, of said ferrite film.

After the ferrite film illumination along the first direction with "writing" combination H+, sigma+ (or H−, sigma−), the conventional demagnetization (using an ac current with an amplitude reduced from maximal to zero), and the succeeding magnetization at the field of 3 or −3 kOe, two different magnetic states (Mrz(+) and Mrz(−)) can appear. The sense and value of remanence for these states depends on the sense of "writing" combination and magnetizing field: (a) Mrz(+)=0.95 mGcm3, Mrz(−)=0; and (b) Mrz(+)=0, Mrz(−)=−1.06 mGcm3 (Table 1). It also means that after an illumination, the ferrite film can be magnetized only in one direction, which is opposite for each of two "writing" combinations. For the non-illuminated ferrite film (c), the remanences Mrz(+) and Mrz(−) are almost equal (or 1.23 and 1.25 mGcm3). This case might be considered as a third magnetic state.

Recording can be also provided using the remanence Mrz(+)=0 in the case (b) and the remanence of the non-illuminated ferrite in the case (c) Mrz(+)=1.23 mGcm3 as "zero" and "one", respectively. The difference between two remanences Mrz(+) in cases (b) and (c) and thus between "0" and "1" is about 100%. The remanences Mrz(−) in the cases (a) and (c) can be used in the same way. The readout of information is carried out in a vertical direction. An existence of three different magnetic states (a), (b), and (c) can be advantageous for magneto-optical recording.

According to the third embodiment, the information can be erased either using the two "erasing" CPL-field combinations (H+, sigma−) and (H−, sigma+) or using heating at temperatures higher than 530 degrees C. at a vacuum of about 0.1 Torr which preserves the valencies of Mn-ions.

The exemplary embodiments described above are merely illustrative of certain applications of the principles of the present invention. Numerous modifications can be made by skilled in the art to the systems and method for using the magneto-optical device as a biasing or pinning magnetic element for the read head and the magnetic force microscope as well as for the magnetic memory cell of the magneto-optical recording, reading and erasing the information described herein without departing from the spirit and scope of the present invention as specified in the appended claims.

What is claimed is:

1. A magneto-optical device (MOD) with an optically induced magnetization, comprising:
    a substrate for receiving a deposited film of ferrite on a surface thereof;
    a ferrite film deposited on the substrate receiving surface, the ferrite film having an illuminatable surface for receiving optical illumination thereon, the substrate being electrically insulating and having a lattice parameter substantially the same as the ferrite film; and
    the ferrite film having an optically induced magnetization resulting from a room-temperature illumination of at least a portion of the illuminatable surface thereof with circularly polarized light (CPL) along a direction substantially normal to the illuminatable surface in the presence of a static magnetic field substantially normal to the ferrite film illuminatable surface.

2. The magneto-optical device (MOD) of claim 1 wherein the substrate comprises MgO.

3. The magneto-optical device (MOD) of claim 2, wherein the ferrite film comprises:
    a magnesium-manganese-cobalt (Mg—Mn—Co) ferrite with Mg, Mn, Co, and Fe ions in a composition range of
    Mg in a range of about 0.72 to about 0.78,
    Mn in a range of about 0.21 to about 0.19,
    Co in a range of about 0.04 to about 0.06,
    Fe in a range of about 1.95 to about 2.05, and
    oxygen in a range of about 4.05 to about 3.95 molecular percents.

4. The magneto-optical device (MOD) of claim 1, wherein, in the absence of an applied magnetic field, a residual optically induced magnetization is fixed in at least one direction.

5. The magneto-optical device (MOD) of claim 3, wherein heating the ferrite film at temperatures not less than 530 degrees C and in a vacuum of about 0.1 Torr erases any optically induced magnetization.

6. A magneto-optical memory bell for magneto-optical recording of information, comprising:
    a magneto-optical storage medium having a plurality of magneto-optical devices for use as respective memory cells for storing information representative using a first and at least a second magnetic state in respective memory cells, the plurality of magneto-optical cells separated from one another by a distance therebetween sufficient to substantially exclude magnetic interaction therebetween;
    the magneto-optical storage medium, wherein recording of a one or the other of the first and second magnetic states is produced in the direction substantially normal to the ferrite film illuminatable surface;
    the magneto-optical storage medium patterned to a size larger than a superparamagnetic size limit for the ferrite material.

7. The magneto-optical device of claim 6, further comprising:
    a magneto-optical writing element having an electromagnet having a soft ferromagnetic yoke with two spaced-apart poles having pole-surfaces substantially parallel to the ferrite film surface and electrically insulated from the ferrite film; and
    a conductive wire electrically isolated from the yoke for causing a magnetic field normal to the ferrite film illuminatable surface in response to a current through the wire.

8. The magneto-optical device with the optically induced magnetization of claim 6, the magneto-optical writing element further comprising:
    a laser diode selectively providing a laser beam to illuminate at least a portion of the illuminatable surface;
    a focal lens, a polarizer for circularly polarizing the laser beam, and a quarter-wave plate, the circularly polarized laser beam illuminating a memory cell to cause selective information recording.

* * * * *